United States Patent
Muramatsu et al.

(10) Patent No.: US 9,029,891 B2
(45) Date of Patent: May 12, 2015

(54) WIRING SUBSTRATE, LIGHT EMITTING DEVICE, AND MANUFACTURING METHOD OF WIRING SUBSTRATE

(71) Applicant: Shinko Electric Industries Co., Ltd., Nagano-shi, Nagano (JP)

(72) Inventors: Shigetsugu Muramatsu, Nagano (JP); Hiroshi Shimizu, Nagano (JP); Kazutaka Kobayashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 35 days.

(21) Appl. No.: 13/749,096

(22) Filed: Jan. 24, 2013

(65) Prior Publication Data

US 2013/0187182 A1   Jul. 25, 2013

(30) Foreign Application Priority Data

Jan. 25, 2012   (JP) ................................ 2012-013242

(51) Int. Cl.
| | |
|---|---|
| *H01L 33/60* | (2010.01) |
| *H05K 3/10* | (2006.01) |
| *H05K 3/20* | (2006.01) |
| *H05K 1/02* | (2006.01) |
| *H05K 3/00* | (2006.01) |

(52) U.S. Cl.
CPC *H01L 33/60* (2013.01); *H05K 3/10* (2013.01); *H05K 1/0274* (2013.01); *H05K 3/0014* (2013.01); *H05K 3/0061* (2013.01); *H05K 3/205* (2013.01); *H05K 2201/0195* (2013.01); *H05K 2201/0376* (2013.01); *H05K 2201/10106* (2013.01); *H05K 2201/2054* (2013.01); *H05K 2201/09409* (2013.01); *H01L 2924/0002* (2013.01); *H01L 2224/13* (2013.01)

(58) Field of Classification Search
CPC .................. H01L 2924/12041; H01L 33/486; H01L 33/62; H01L 33/64
USPC .............................. 257/98, 99, 676, E33.072
See application file for complete search history.

(56) References Cited

U.S. PATENT DOCUMENTS

| | | | |
|---|---|---|---|
| 3,152,938 A | 10/1964 | Osifchin et al. | |
| 8,368,206 B2 * | 2/2013 | Shiraishi et al. | .............. 257/713 |
| 2003/0178227 A1 | 9/2003 | Matsunaga et al. | |

(Continued)

FOREIGN PATENT DOCUMENTS

| | | |
|---|---|---|
| EP | 0 989 610 A2 | 3/2000 |
| EP | 1 261 028 A2 | 11/2002 |

(Continued)

OTHER PUBLICATIONS

U.S. Appl. No. 13/748,903, Shinko Electric Industries Co., Ltd.
U.S. Appl. No. 13/749,070, Shinko Electric Industries Co., Ltd.

*Primary Examiner* — Minh-Loan Tran
(74) *Attorney, Agent, or Firm* — Drinker Biddle & Reath LLP

(57) ABSTRACT

There is provided a wiring substrate. The wiring substrate includes: a heat sink; an insulating member on the heat sink; a wiring pattern embedded in the insulating member and including a first surface and a second surface opposite to the first surface, the second surface contacting the insulating member; and a metal layer on the first surface of the wiring pattern, wherein an exposed surface of the metal layer is flush with an exposed surface of the insulating member.

6 Claims, 17 Drawing Sheets

(56) References Cited

U.S. PATENT DOCUMENTS

| | | |
|---|---|---|
| 2006/0012991 A1 | 1/2006 | Weaver, Jr. et al. |
| 2009/0161343 A1 | 6/2009 | Park et al. |
| 2009/0178828 A1 | 7/2009 | Tsumura et al. |
| 2011/0132644 A1 | 6/2011 | Nishi et al. |

FOREIGN PATENT DOCUMENTS

| | | |
|---|---|---|
| EP | 2 455 991 A1 | 5/2012 |
| JP | H05-218606 A | 8/1993 |
| JP | 2003-092011 A | 3/2003 |
| WO | WO 2011/007874 A1 | 1/2011 |

* cited by examiner

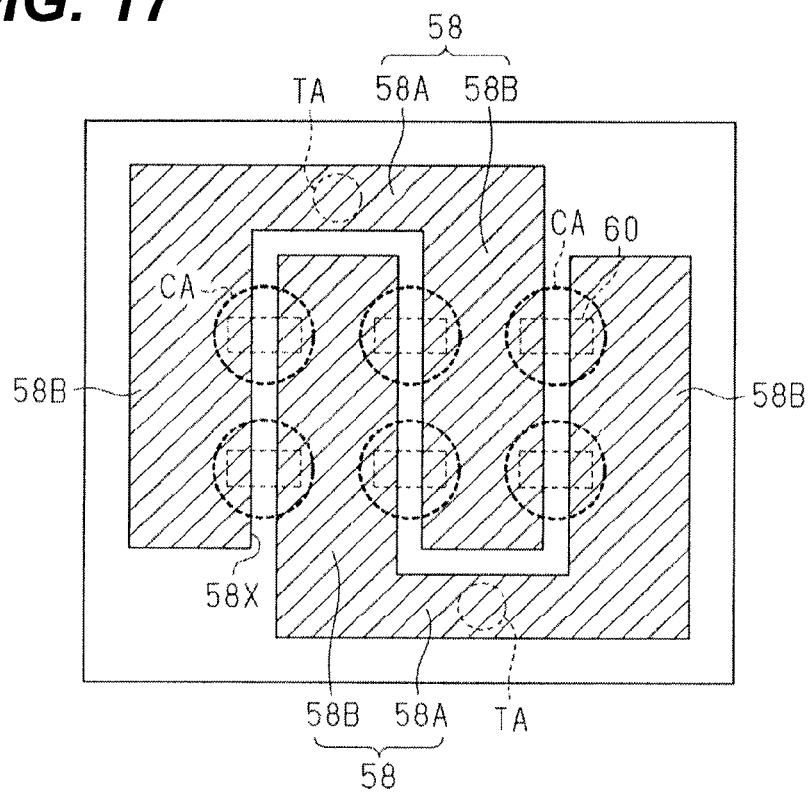

WIRING SUBSTRATE, LIGHT EMITTING DEVICE, AND MANUFACTURING METHOD OF WIRING SUBSTRATE

This application claims priority from Japanese Patent Application No. 2012-013242, filed on Jan. 25, 2012, the entire contents of which are herein incorporated by reference.

BACKGROUND

1. Technical Field

The present disclosure relates to a wiring substrate, a light emitting device, and a manufacturing method of the wiring substrate.

2. Description of the Related Art

In the related art, various shapes of light emitting devices in which light emitting elements are mounted on a substrate, have been proposed. As this kind of light emitting device, a structure is known in which wiring layers are formed on an insulating layer formed on a substrate made of metal, and a light emitting element such as a light emitting diode (LED) is mounted on the wiring layers (for example, see JP-A-2003-092011).

In recent years, the usage of the light emitting device has been expanded to an illumination apparatus, a display apparatus, and the like. For this usage, a plurality of light emitting elements are preferably mounted with high density. In order to satisfy this demand, miniaturization of the light emitting element has been developed. Along with the miniaturization, miniaturization of bumps used to mount the light emitting element in a flip-chip form on the wiring layers has been developed, and thus a gap between the light emitting element and the wiring layers becomes narrowed. On the other hand, in a recent light emitting device, in order to efficiently use light emitted by the light emitting element, a reflective layer having high reflectance is formed on an element mounting surface. However, if the reflective layer is formed, there is a problem in that the reflective layer and the fine light emitting element tend to interfere (contact) with each other. For this reason, it is desirable to develop a light emitting device which can suppress interference between the reflective layer and the light emitting element and mount the fine light emitting element stably thereon.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a wiring substrate. The wiring substrate includes: a heat sink; an insulating member on the heat sink; a wiring pattern embedded in the insulating member and including a first surface and a second surface opposite to the first surface, the second surface contacting the insulating member; and a metal layer on the first surface of the wiring pattern, wherein a surface of the metal layer is flush with an exposed surface of the insulating member.

According to the aspect of the present invention, it is possible to provide a wiring substrate capable of suppressing interference between the reflective layer and the light emitting element and accommodating the miniaturization of the light emitting element.

Other aspects and advantages of the present invention will be apparent from the following description, the drawings and the claims.

BRIEF DESCRIPTION OF THE DRAWINGS

FIG. 4C is a schematic plan view illustrating the manufacturing steps of the wiring substrate according to the embodiment, wherein FIGS. 4A, 4B and 4D show a cross-sectional view of the wiring substrate taken along the line C-C position of FIG. 4C;

FIG. 5B is a schematic plan view illustrating the manufacturing steps of the wiring substrate according to the embodiment, wherein FIGS. 5A and 5C show a cross-sectional view of the wiring substrate taken along the line D-D position of FIG. 5B;

FIGS. 6A to 6D are schematic cross-sectional views illustrating the manufacturing steps of the wiring substrate according to the embodiment, wherein FIGS. 6A to 6D show a cross-sectional view of the wiring substrate taken along the line D-D position of FIG. 5B;

FIGS. 7A and 7B are schematic cross-sectional views illustrating the manufacturing steps of the wiring substrate according to the embodiment, wherein FIGS. 7A and 7B show a cross-sectional view of the light emitting device taken along the line B-B position of FIG. 2A;

FIGS. 8A to 8D are schematic cross-sectional views illustrating manufacturing steps of a wiring substrate according to a modified example of the embodiment, wherein FIGS. 8A to 8D show a cross-sectional view of the wiring substrate taken along the line D-D position of FIG. 5B;

FIGS. 9A to 9C are schematic cross-sectional views illustrating manufacturing steps of a wiring substrate according to a modified example of the embodiment, wherein FIGS. 9A to 9C show a cross-sectional view of the wiring substrate taken along the line D-D position of FIG. 5B;

FIGS. 10A and 10B are schematic cross-sectional views illustrating manufacturing steps of a wiring substrate according to a modified example of the embodiment, wherein FIGS. 10A and 10B show a cross-sectional view of the wiring substrate taken along the line D-D position of FIG. 5B;

FIGS. 11A to 11D are schematic cross-sectional views illustrating manufacturing steps of a wiring substrate according to a modified example of the embodiment, wherein FIGS. 11A to 11D show a cross-sectional view of the wiring substrate taken along the line D-D position of FIG. 5B;

Figure 5A:
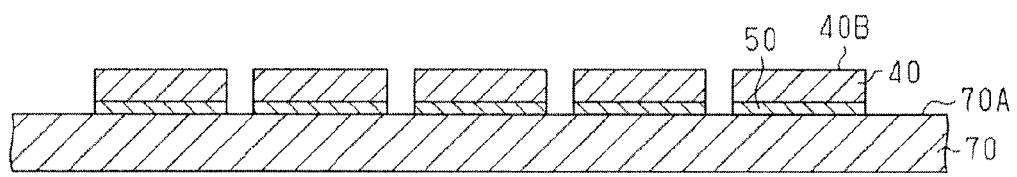
FIGS. 5A and 5C are schematic cross-sectional views illustrating the manufacturing steps of the wiring substrate according to the embodiment.
Figure 5B:
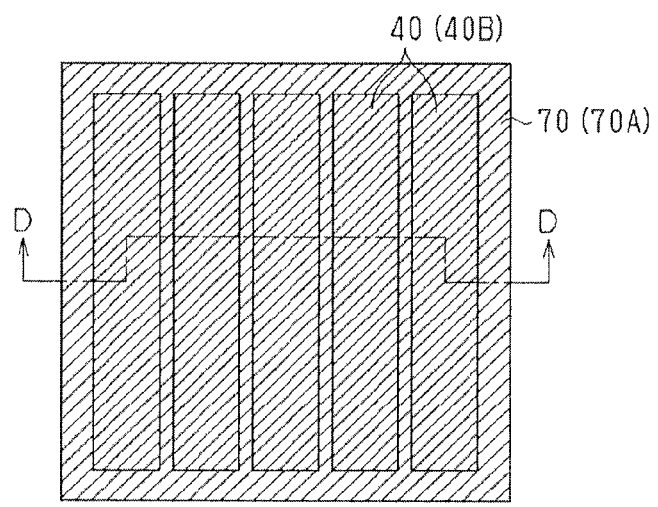
Figure 13A:
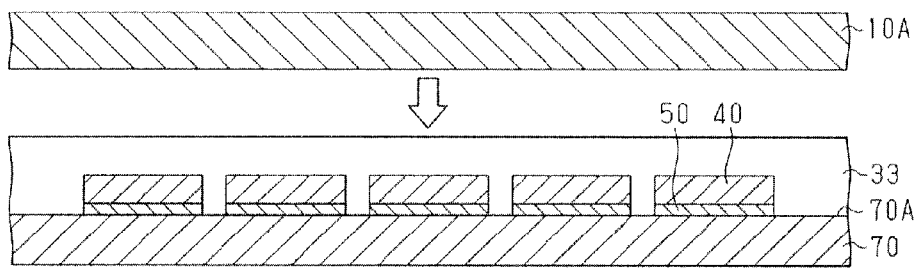
Figure 13B:
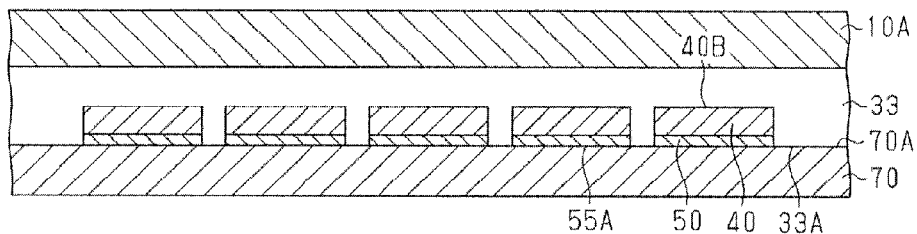
Figure 14A:
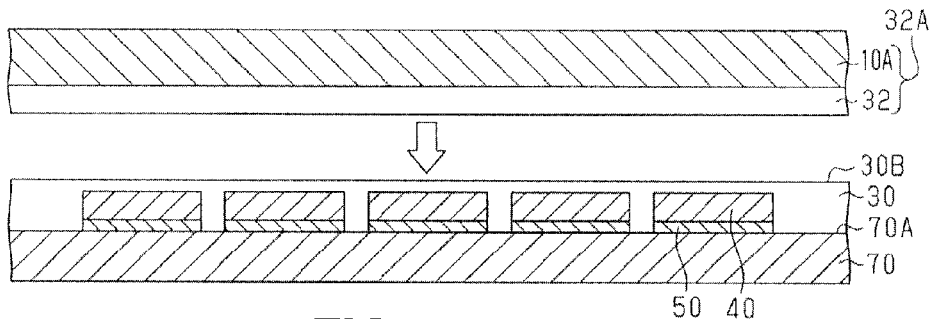
Figure 14B:
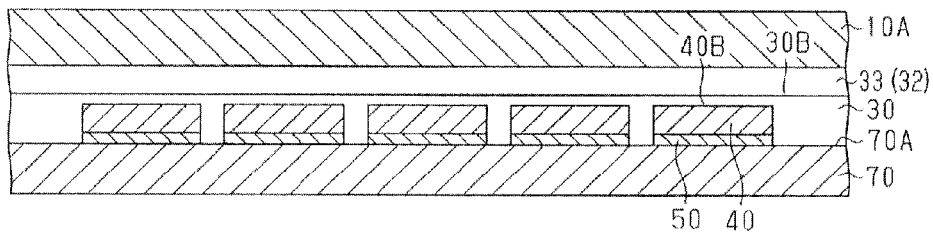
Figure 16A:
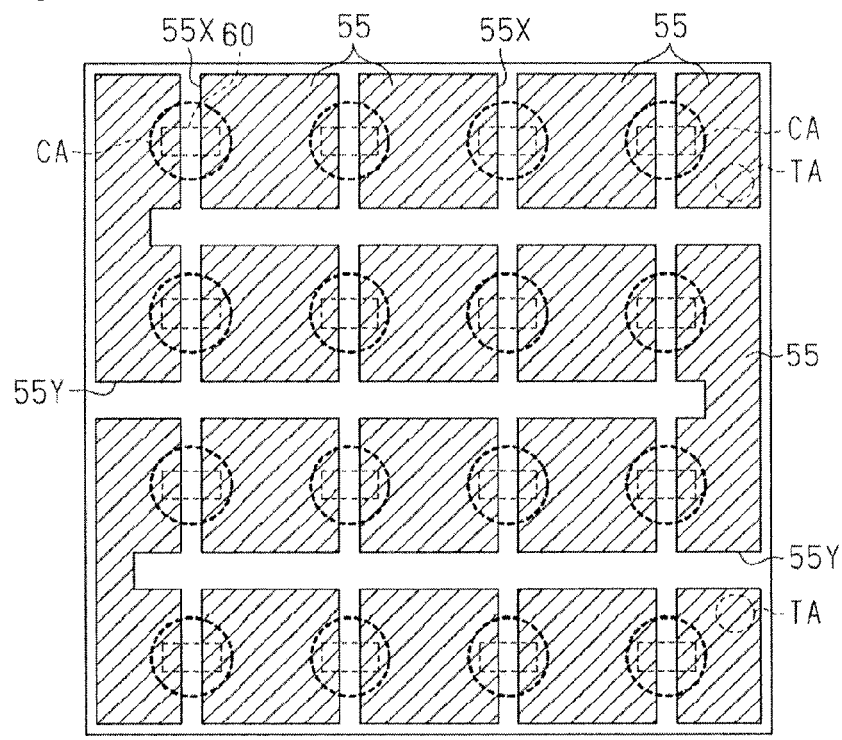
Figure 16B:
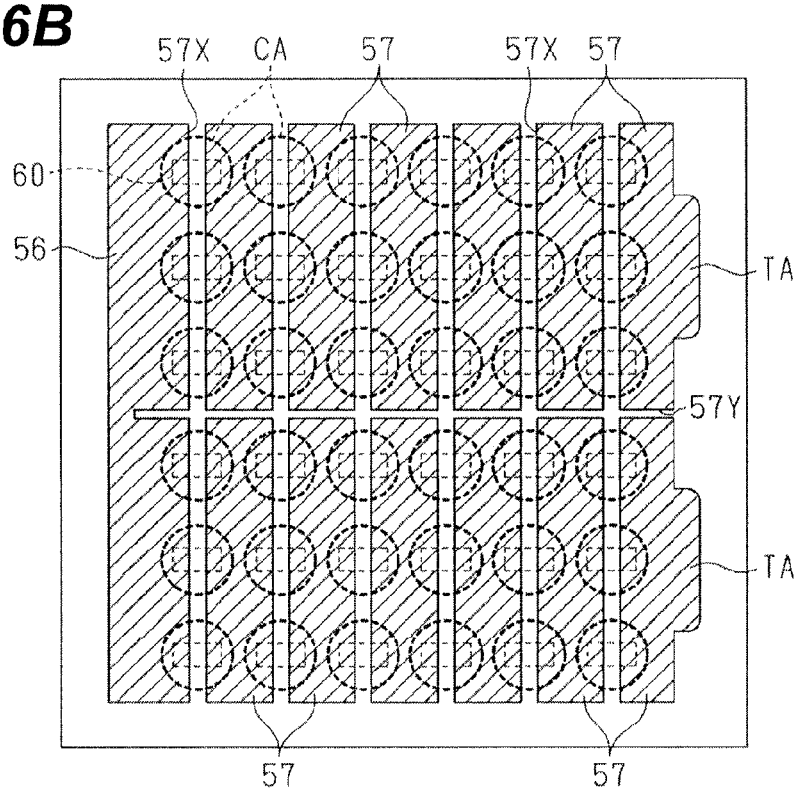
Figure 18:
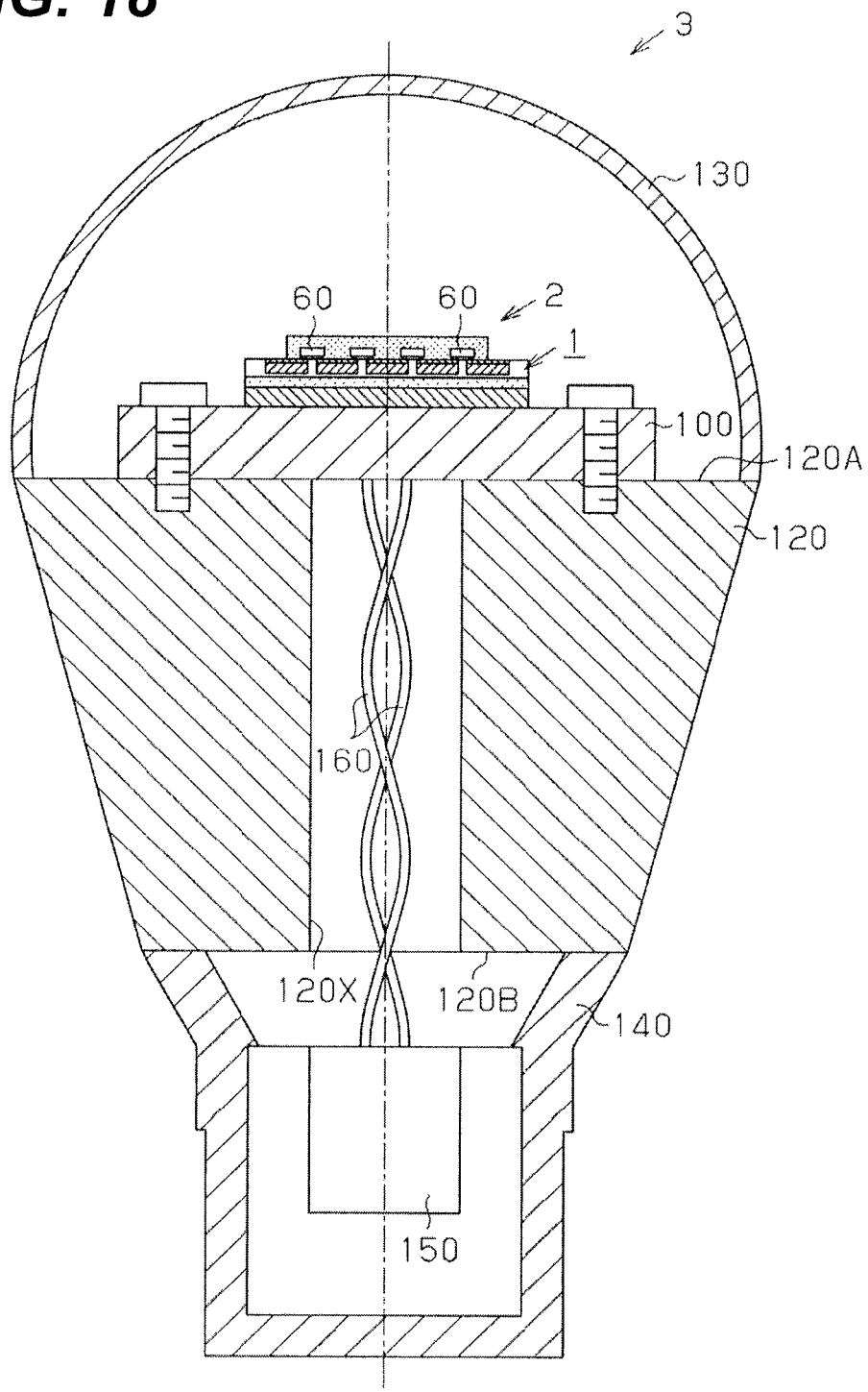
Figure 19A:
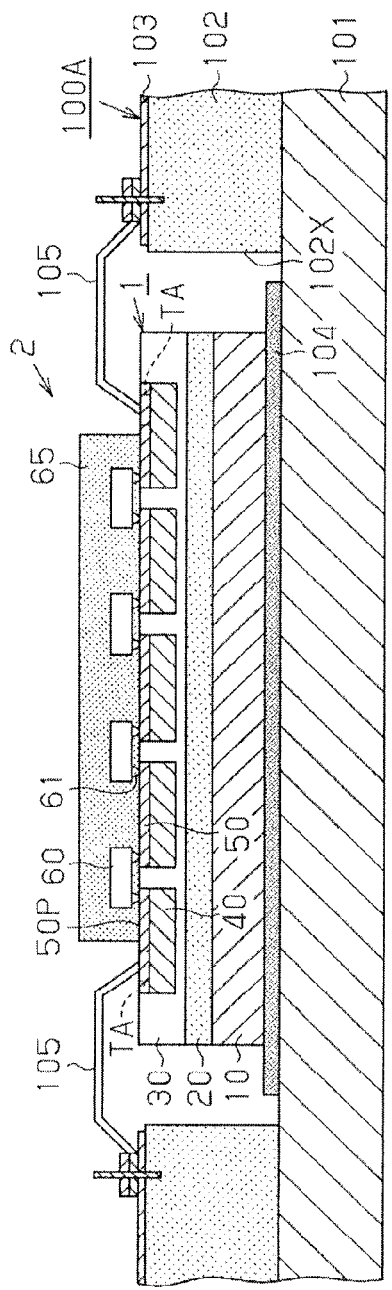
Figure 19B:
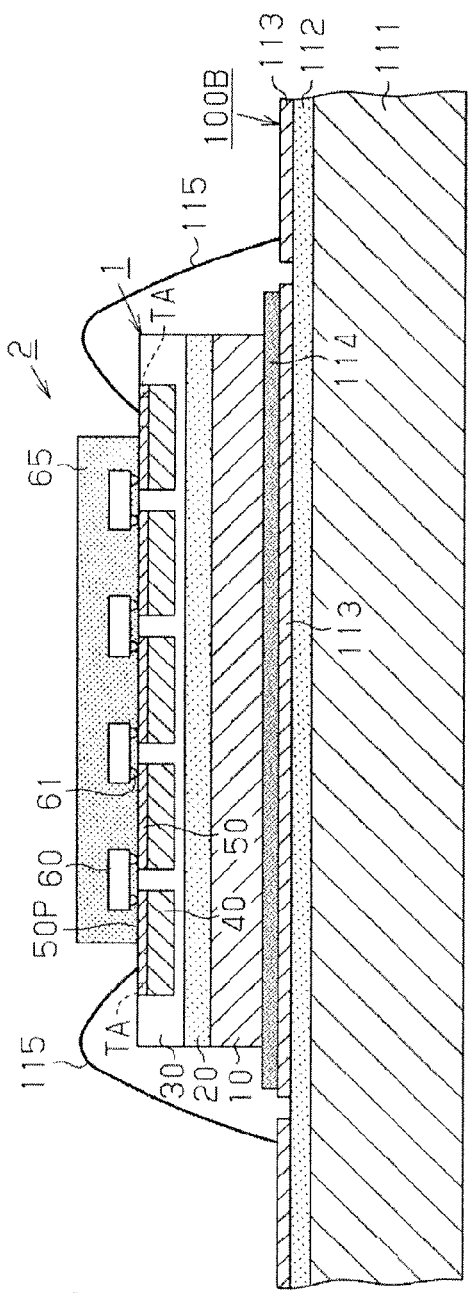

12A to 12C show a cross-sectional view of the wiring substrate taken along the line D-D position of FIG. 5B;

FIGS. 13A and 13B are schematic cross-sectional views illustrating manufacturing steps of a wiring substrate according to a modified example of the embodiment, wherein FIGS. 13A and 13B show a cross-sectional view of the wiring substrate taken along the line D-D position of FIG. 5B;

FIGS. 14A and 14B are schematic cross-sectional views illustrating manufacturing steps of a wiring substrate according to a modified example of the embodiment, wherein FIGS. 14A and 14B show a cross-sectional view of the wiring substrate taken along the line D-D position of FIG. 5B;

FIGS. 15A to 15D are schematic cross-sectional views illustrating manufacturing steps of a wiring substrate and a light emitting device according to a modified example of the embodiment, wherein FIGS. 15A to 15D show a cross-sectional view of the wiring substrate and the light emitting device taken along the line D-D position of FIG. 5B;

FIGS. 16A and 16B are schematic plan views illustrating a metal layer according to a modified example of the embodiment;

FIG. 17 is a schematic plan view illustrating a metal layer according to a modified example of the embodiment;

FIG. 18 is a schematic cross-sectional view illustrating an application example of the light emitting device; and FIGS. 19A and 19B are schematic cross-sectional views illustrating a mounting example of the light emitting device.

DETAILED DESCRIPTION OF EXEMPLARY EMBODIMENTS

Hereinafter, exemplary embodiments of the present invention will be described with reference to the accompanying drawings. In all the drawings for the explanation of the embodiments, the members having the same functions are represented by the same reference numerals, and repeated description thereof will be omitted.

In addition, for convenience, in the accompanying drawings, there are cases in which featured portions are shown appropriately enlarged to easily understand features thereof, and the dimensions of each constituent element may be different from practical dimensions thereof. Further, in a cross-sectional view, hatching of some members is omitted in order to easily understand a cross-sectional view of each member.

First Embodiment

Hereinafter, the first embodiment will be described with reference to FIGS. 1 to 7.

(Structure of Wiring substrate)

Figure 1A:
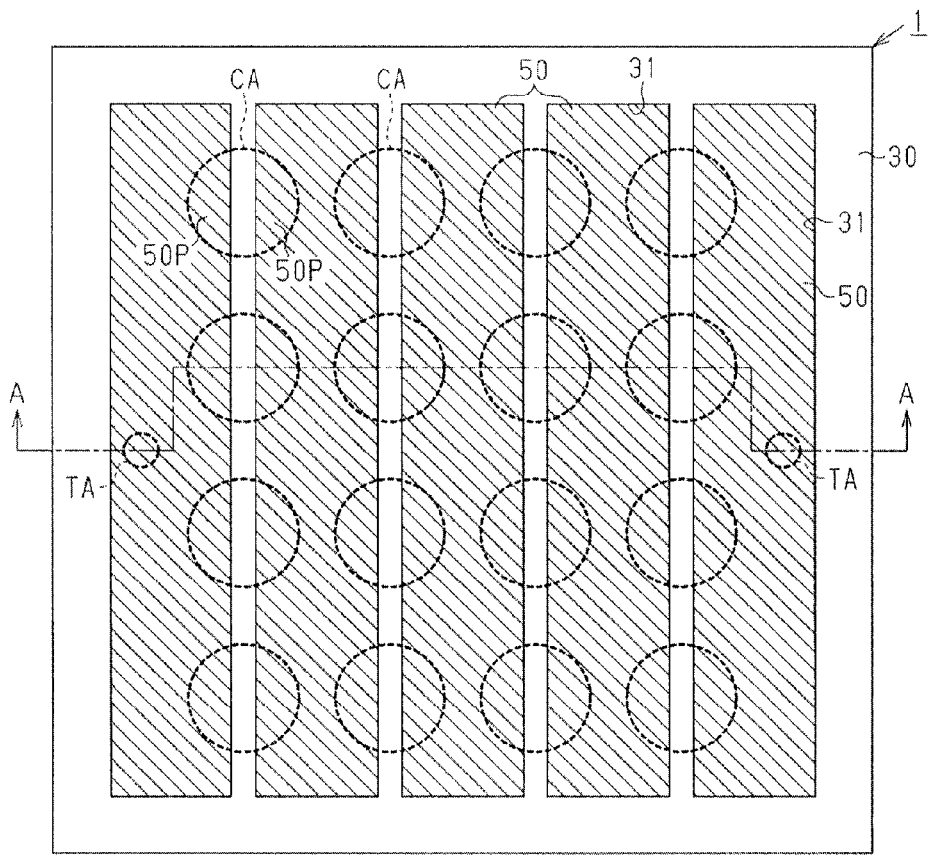
FIG. 1A is a schematic plan view illustrating a wiring substrate according to an embodiment.
Figure 1B:
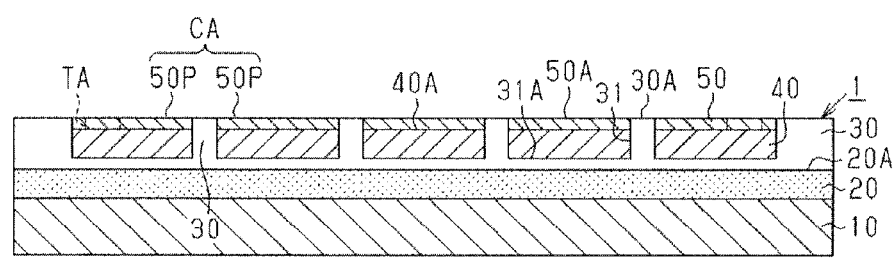
FIG. 1B is a schematic cross-sectional view taken along the line A-A of the wiring substrate shown in FIG. 1A.

As shown in FIG. 1B, a wiring substrate 1 includes a heat sink 10, an insulating layer 20 covering the upper surface of the heat sink 10, a reflective layer 30 formed on the insulating layer 20, wiring patterns 40 embedded in the reflective layer 30, and metal layers 50 formed on the wiring patterns 40. This wiring substrate 1 is a wiring substrate applied to, for example, a light emitting device.

The heat sink 10 is, for example, an approximately rectangular thin plate in plan view. As a material of the heat sink 10, for example, a metal with favorable heat conductivity such as copper (Cu) or aluminum (Al), or an alloy including at least one of these metals may be used. In addition, as a material of the heat sink 10, for example, a ceramic material with favorable heat conductivity such as aluminum nitride or alumina may be used. The thickness of the heat sink 10 may be, for example, about 0.5 mm to 1.0 mm.

The insulating layer 20 is formed so as to cover the entire upper surface of the heat sink 10. As a material of the insulating layer 20, for example, an insulating resin with high heat conductivity (for example, about 1 W/mK to 10 W/mK) may be used. Specifically, as a material of the insulating layer 20, for example, an insulating resin such as a polyimide resin or an epoxy resin, or a resin material where a filler such as silica or alumina is mixed with the resin may be used. The thickness of the insulating layer 20 may be, for example, about 50 μm to 80 μm. The insulating layer 20 has a function of insulating the heat sink 10 from the wiring patterns 40, and a function of adhering the heat sink 10 to the reflective layer 30. Further, in a case where the insulating layer 20 has high insulation properties, the insulating layer 20 is preferably formed thinly from the viewpoint of heat dissipation.

The reflective layer 30 is formed so as to cover the entire first main surface 20A of the insulating layer 20. The reflective layer 30 has high reflectance. Specifically, the reflective layer 30 has reflectance of 50% or more (preferably, 80% or more) between the wavelength 450 nm to 700 nm. The reflective layer 30 is also referred to as a white resist layer. As a material of the reflective layer 30, for example, a white insulating resin may be used. As the white insulating resin, for example, a resin material where a filler or a pigment formed from white titanium oxide ($TiO_2$) or barium sulfate ($BaSO_4$) is contained in an epoxy resin, a silicon resin, or an organopolysiloxane resin. The reflective layer 30 (white resist layers) covers the outermost surface of the wiring substrate 1, and thereby it is possible to reduce light amount loss of light emitting elements by increasing the reflectance of light from the light emitting elements mounted on the wiring substrate 1 as well as protecting the wiring patterns 40. In addition, the thickness of the reflective layer 30 may be, for example, 20 μm to 130 μm.

In addition, in the first main surface 30A (the upper surface in FIG. 1B) of the reflective layer 30, recessed portions 31 are formed at necessary locations (FIG. 1B, five). Each of the recessed portions 31 is formed from the first main surface 30A of the reflective layer 30 to a middle position of the reflective layer 30 in the thickness direction. That is, each of the recessed portions 31 is formed such that the bottom surface 31A of the recessed portion 31 is positioned in the middle of the reflective layer 30 in the thickness direction. As shown in FIG. 1A, a planar shape of the recessed portion 31 is formed in a strip shape in plan view or in a rectangular shape in plan view. In addition, the plurality of recessed portions 31 are formed in parallel so as to be adjacent to each other.

As shown in FIG. 1B, the wiring patterns 40 are formed on the bottom surfaces 31A of the respective recessed portions 31. The plurality of wiring patterns 40 are formed in parallel so as to be adjacent to each other. The side surface of each wiring pattern 40 is covered by the reflective layer 30 forming the side walls of the recessed portions 31. In addition, the adjacent wiring patterns 40 are electrically separated by the reflective layer 30 forming the side walls of the recessed portions 31. As such, the wiring pattern 40 is formed so as to be embedded in the reflective layer 30. In addition, although not shown, a planar shape of each wiring pattern 40 is formed in a strip shape in plan view or in a rectangular shape in plan view in the same manner as the planar shape of the recessed portion 31. Further, as a material of the wiring pattern 40, for example, copper or a copper alloy may be used. The thickness of the wiring pattern 40 may be, for example, about 30 μm to 100 μm. In addition, the distance between the adjacent wiring patterns 40 may be, for example, about 0.1 mm to 0.3 mm.

The metal layer 50 is formed in the recessed portion 31 so as to cover the entire first main surface 40A (the upper surface in FIG. 1B) of each wiring pattern 40. Specifically, as shown in FIG. 1A, a plurality of (in FIG. 1A, five) metal layers 50 with a strip shape in plan view (a rectangular shape in plan view) are formed in parallel so as to be adjacent to each other. In addition, the adjacent metal layers 50 are electrically separated by the reflective layer 30 forming the side walls of the recessed portions 31. As shown in FIG. 1B, each of the metal layers 50 is formed such that the first main surface 50A (the upper surface in FIG. 1B) thereof is flush with the first main surface 30A of the reflective layer 30. For this reason, in the metal layer 50, the entire first main surface 50A thereof is exposed from the reflective layer 30. Further, as shown in FIG. 1A, the metal layers 50 exposed from the reflective layer 30 have a plurality of regions which are mounting regions CA in which light emitting elements 60 (refer to FIG. 2) are mounted, and have a pair of terminal regions TA functioning as electrode terminals. Here, the mounting regions CA are arranged in a matrix (4×4 in FIG. 1A) on the metal layers 50. In the mounting regions CA, a pair of metal layers 50 which are separated by the reflective layer 30 forming the side walls of the recessed portions 31 and are formed with the reflective layer 30 interposed therebetween are exposed to outside. The pair of metal layers 50 respectively function as pads 50P to which the light emitting elements 60 (refer to FIG. 2) are bonded. In addition, a pair of terminal regions TA are disposed on the metal layers 50 to the outside of the mounting regions CA. Specifically, a pair of terminal regions TA are formed on two metal layers 50 disposed at the outermost positions of the five metal layers 50 and are formed to the outside of the mounting regions CA disposed in the metal layers 50.

An example of the metal layer 50 may include a silver (Ag) layer, a nickel (Ni)/gold (Au) layer (a metal layer where an Ni layer and an Au layer are formed in this order), an Ni/Ag layer (a metal layer where an Ni layer and an Ag layer are formed in this order), an Ni/palladium (Pd)/Au layer (a metal layer where an Ni layer, a Pd layer, and an Au layer are formed in this order), or the like. Further, an example of the metal layer 50 may include an Ni/Pd/Ag layer (a metal layer where an Ni layer, a Pd layer, and an Ag layer are formed in this order), an Ni/Pd/Ag/Au layer (an Ni layer, a Pd layer, an Ag layer, and an Au layer are formed in this order), or the like. Furthermore, in a case where the metal layer 50 is, for example, an Ni/Au layer, the thickness of the Ni layer may be about 1 µm to 10 µm, and the thickness of the Au layer may be about 0.05 µm to 2 µm.

(Structure of Light Emitting Device)

Next, a structure of a light emitting device 2 will be described.

Figure 2A:
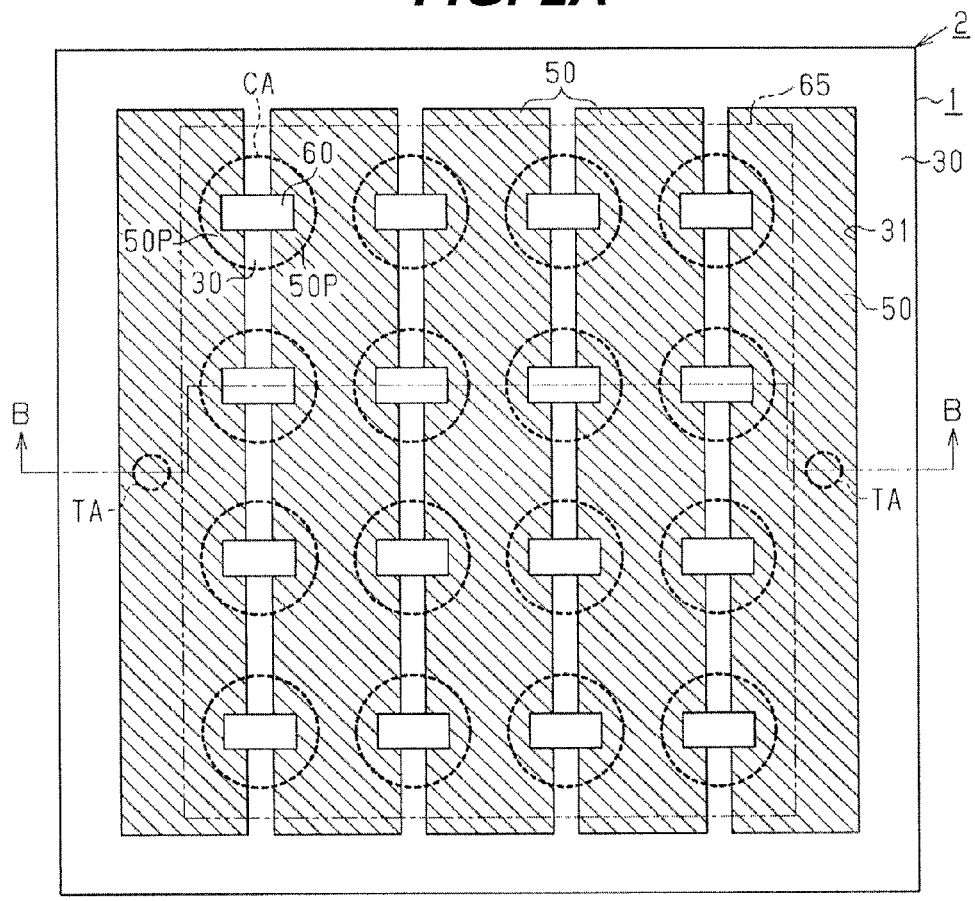
FIG. 2A is a schematic plan view illustrating a light emitting device according to an embodiment.
Figure 2B:
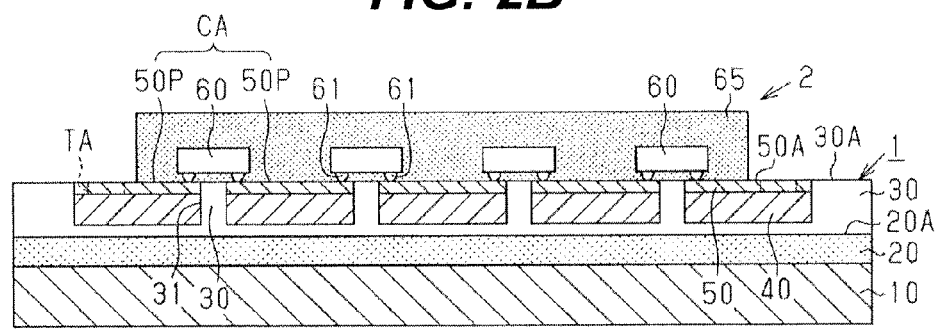
FIG. 2B is a schematic cross-sectional view taken along the line B-B of the light emitting device shown in FIG. 2A.

As shown in FIG. 2B, the light emitting device 2 includes the above-described wiring substrate 1, a plurality of (in FIG. 2A, sixteen) light emitting elements 60 mounted on the wiring substrate 1, and an encapsulating resin 65 which encapsulates the light emitting elements 60 and the like.

Each light emitting element 60 is mounted on a pair of pads 50P formed in each mounting region CA of the wiring substrate 1. Specifically, each light emitting element 60 is flip-chip mounted on two pads 50P formed on both sides of the reflective layer 30 so as to cross over the reflective layer 30 formed between the pair of pads 50P, that is, the reflective layer 30 forming the side walls of the recessed portions 31. More specifically, one bump 61 formed on one surface (the lower surface in FIG. 2B) of the light emitting element 60 is flip-chip bonded to one pad 50P of the two pads 50P, and the other bump 61 is flip-chip bonded to the other pad 50P. Thereby, each bump 61 of each light emitting element 60 is electrically connected to the wiring pattern 40 via the pad 50P (the metal layer 50). In addition, as shown in FIG. 2A, the light emitting elements 60 are arranged in a matrix (4×4 in FIG. 2A) on the wiring substrate 1. For this reason, in the light emitting device 2, between the pair of terminal regions TA, four light emitting elements 60 are connected in series, and four groups of the serially connected light emitting elements 60 are connected in parallel. In addition, the light emitting elements 60 are supplied with power from an external power source (not shown) via the metal layers 50 formed in the terminal regions TA or the wiring patterns 40 and emit light. Further, a planar shape of the light emitting element 60 is formed, for example, in a rectangular shape, and the size thereof may be, for example, about 0.3 mm$^2$ to 0.5 mm$^2$. Furthermore, the height of the bump 61 may be, for example, about 30 µl to 100 µm.

As the light emitting element 60, for example, a light emitting diode (LED) or a vertical cavity surface emitting laser (VCSEL) may be used. As the bump 61, for example, a gold bump or a solder bump may be used. As a material of the solder bump, for example, an alloy including lead (Pb), an alloy of tin (Sn) and Au, an alloy of Sn and Cu, an alloy of Sn and Ag, an alloy of Sn, Ag and Cu, or the like may be used.

As shown in FIG. 2B, the encapsulating resin 65 is provided on the upper surface of the wiring substrate 1 so as to encapsulate the light emitting elements 60, the bumps 61, and the like. As a material of the encapsulating resin 65, for example, a resin material where a fluorescent substance is contained in a silicon resin may be used. The resin material containing the fluorescent substance is formed on the light emitting elements 60, thus a mixed color of emission of the light emitting element 60 and emission of the fluorescent substance can be used, and thereby it is possible to control various emission colors of the light emitting device 2.

(Operation)

In the wiring substrate 1 according to the present embodiment, the first main surface 30A (the outermost surface) of the reflective layer 30 formed in the outermost surface of the mounting surface side where the light emitting element 60 is mounted is formed so as to be flush with the first main surface 50A (the outermost surface) of the metal layer 50 functioning as the pad 50P. That is, the surface of the reflective layer 30 is formed so as to be flush with the pad 50P. Thereby, since the reflective layer 30 does not protrude further upward than the surface of the pad 50P, interference (contact) between the reflective layer 30 and the light emitting element 60 is appropriately suppressed.

(Manufacturing Method of Wiring Substrate)

Next, a manufacturing method of the wiring substrate 1 will be described with reference to FIGS. 3 to 6.

Figure 3:
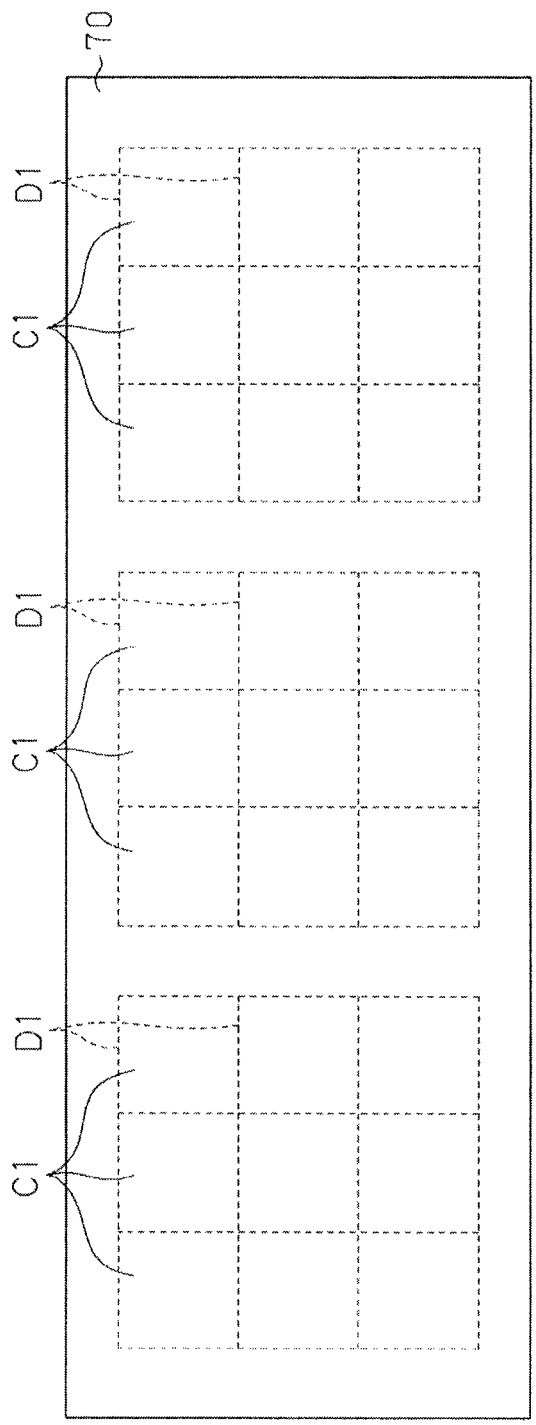
FIG. 3 is a schematic plan view illustrating a manufacturing method of the wiring substrate according to an embodiment.
Figure 4A:
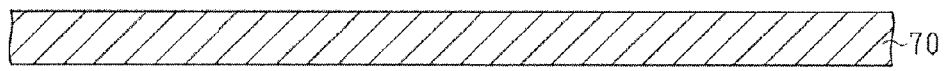
FIGS. 4A, 4B and 4D are schematic cross-sectional views illustrating manufacturing steps of the wiring substrate according to the embodiment.

First, in order to manufacture the wiring substrate 1, as shown in FIGS. 3 and 4A, a multi-piece supporting substrate 70 is prepared. The supporting substrate 70 has a plurality of (in FIG. 3, three) partitions where wiring substrate forming regions C1 which are regions in which the wiring substrate 1 is formed are formed in a matrix (3×3 in FIG. 3). As the supporting substrate 70, for example, a metal plate or metal foil may be used, and, in the present embodiment, for example, a copper plate is used. The thickness of the supporting substrate 70 may be, for example, 0.3 mm to 1.0 mm. In the present manufacturing method, a member which will become the wiring substrate 1 is formed in the wiring substrate forming region C1, and is cut along the positions corresponding to the cutting lines D1 using a dicing blade or the like after the supporting substrate 70 is removed, and thereby a structure corresponding to the wiring substrate 1 is formed as a unit piece. In addition, for convenience of description, in FIGS. 4 to 6 described later, a structure of a single wiring substrate forming region C1 is shown.

Figure 4B:
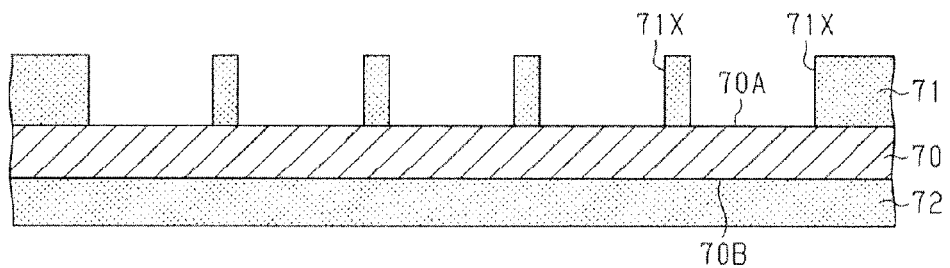
Figure 4C:
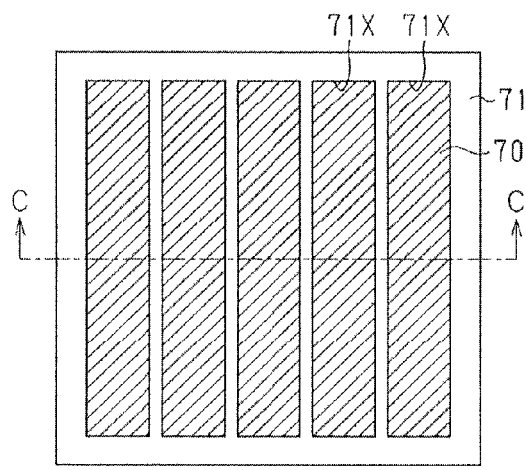

Next, in the step shown in FIG. 4B, a resist layer 71 having openings 71X is formed on the first main surface 70A (the upper surface in the figure) of the supporting substrate 70, and a resist layer 72 which covers the entire second main surface 70B (the lower surface in the figure) of the supporting substrate 70 is formed. Here, the first main surface 70A of the supporting substrate 70 is planarized. The opening 71X is formed so as to expose the first main surface 70A of the supporting substrate 70 of a portion corresponding to the forming region of the wiring patterns 40 and the metal layers 50 (see FIG. 1). In other words, as shown in FIG. 4C, a plurality of (in FIG. 4C, five) openings 71X with a strip shape in plan view (a rectangular shape in plan view) are formed in parallel so as to be adjacent to each other in the resist layer 71. As shown in FIG. 4B, the resist layer 71 is formed relatively thickly (for example, about 0.05 mm to 0.15 mm). The resist layer 71 may be formed thickly by overlapping a plurality of resist layers. On the other hand, the thickness of the resist layer 72 is sufficient as long as the resist layer 72 covers the entire second main surface 70B so as to prevent the second main surface 70B of the supporting substrate 70 from being plated in the subsequent step, and may be, for example, about 0.02 mm to 0.05 mm. In addition, as a material of the resist layers 71 and 72, a plating resistant material may be used. Specifically, as a material of the resist layers 71 and 72, a photosensitive dry film resist, a liquid photoresist (for example, a dry film resist or a liquid resist of a Novolac resin, an acryl resin, or the like), and the like may be used. For example, in a case of using the photosensitive dry film resist, a dry film is formed on both the surfaces of the supporting substrate 70 through thermocompression, and the dry film formed on the first main surface 70A of the supporting substrate 70 is patterned through exposure and development, thereby forming the resist layers 71 and 72. Further, in a case where the liquid photoresist is used as well, the resist layers 71 and 72 may be formed through the same steps.

Figure 4D:
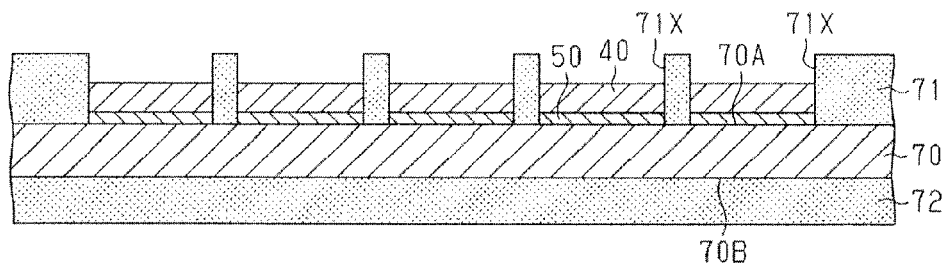

Next, in the step shown in FIG. 4D, electrolytic plating where the supporting substrate 70 is used as a plating feed layer is performed on the first main surface 70A of the supporting substrate 70 by using the resist layers 71 and 72 as a plating mask. Specifically, by performing the electrolytic plating on the first main surface 70A of the supporting substrate 70 exposed from the openings 71X of the resist layer 71, the metal layers 50 and the wiring patterns 40 are sequentially formed in the openings 71X. For example, in a case where the metal layer 50 is a structure in which an Au layer and an Ni layer are sequentially formed in this order, and the wiring pattern 40 is a Cu layer, first, the Au layer and the Ni layer are formed in order on the first main surface 70A of the supporting substrate 70 through an electrolytic plating method where the supporting substrate 70 is used as a plating feed layer, thereby forming the metal layer 50. Next, the Cu layer is formed on the metal layer 50 through the electrolytic plating method where the supporting substrate 70 is used as a plating feed layer, thereby forming the wiring pattern 40.

Next, in the step shown in FIG. 5A, the resist layers 71 and 72 shown in FIG. 4D are removed by, for example, an alkaline stripping agent. At this time, as shown in FIG. 5B, a plurality of wiring patterns 40 with a strip shape in plan view (a rectangular shape in plan view) are exposed in the upper surface of the supporting substrate 70.

Figure 5C:
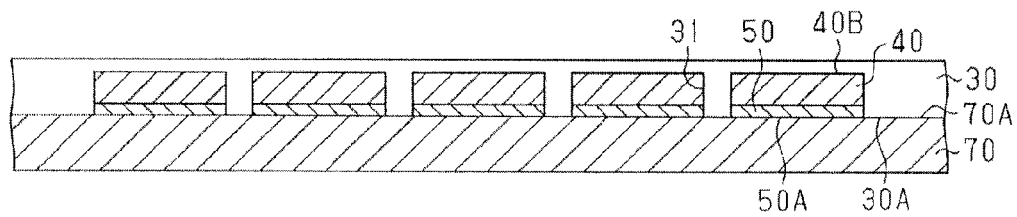

Next, in the step shown in FIG. 5C, the reflective layer 30 is formed so as to cover the metal layers 50 and the wiring patterns 40 on the first main surface 70A of the supporting substrate 70. The reflective layer 30 is formed so as to cover the entire side surfaces of the metal layers 50, the entire side surfaces of the wiring patterns 40, and the entire second main surfaces 40B (the upper surfaces in FIG. 5C) of the wiring patterns 40. In other words, in this step, the reflective layer 30 which has the recessed portions 31 accommodating the metal layers 50 and the wiring patterns 40 is formed. In addition, at this time, the first main surface 30A of the reflective layer 30 and the first main surface 50A of the metal layer 50 which come into contact with the first main surface 70A of the supporting substrate 70 are formed in a shape along the first main surface 70A (planarized surface) of the supporting substrate 70. In other words, the shape of the first main surface 70A of the supporting substrate 70 is transferred onto the first main surface 30A of the reflective layer 30 and the first main surface 50A of the metal layer 50. For this reason, the first main surface 30A of the reflective layer 30 and the first main surface 50A of the metal layer 50 are planarized, and the first main surface 30A and the first main surface 50A are formed so as to be flush with each other.

The reflective layer 30 may be formed through, for example, a screen printing method using a resin paste. At this time, as described above, since the reflective layer 30 is formed so as to cover the entire second main surfaces 40B of the wiring patterns 40, the resin paste can be ejected onto the entire first main surface 70A of the supporting substrate 70. Therefore, it is possible to form the reflective layer 30 on the first main surface 70A of the supporting substrate 70 without considering misalignment or blurring which is problematic in the screen printing method. Thereby, even if a gap between the wiring patterns 40 and a gap between the metal layers 50 are narrowed, it is possible to easily form the reflective layer 30 between the wiring patterns 40 and between the metal layers 50.

Next, in the step shown in FIG. 5C, the reflective layer 30 is cured by performing a heat curing treatment in an atmosphere of a temperature of about 150° C. Next, in the step shown in FIG. 6A, the supporting substrate 70 (refer to FIG. 5C) which is used as a temporary substrate is removed. For example, in a case where a copper plate is used as the supporting substrate 70, the supporting substrate 70 may be removed through wet etching using a ferric chloride solution, a cupric chloride solution, an ammonium persulfate solution, or the like. At this time, since the reflective layer 30 is made of a resin material, and the outermost surface of the metal layer 50 exposed from the reflective layer 30 is an Au layer or the like, only the supporting substrate 70 which is a copper plate can be selectively etched. When the supporting substrate 70 is removed in this way, the first main surfaces 50A of the metal layers 50 and the first main surface 30A of the reflective layer 30 which are formed so as to be flush with each other are exposed. At this time, the metal layers 50 formed in the mounting regions CA are exposed as the pads 50P, and the metal layers 50 formed in the terminal regions TA are exposed as electrode terminals.

Next, in the step shown in FIG. 6B, a structure 22 where a sheet-shaped insulating layer 21 which will become the insulating layer 20 is adhered to a multi-piece substrate (hereinafter, also simply referred to as a "substrate") 10A is prepared. Although not shown, the substrate 10A has a plurality of wiring substrate forming regions C1 in the same manner as the supporting substrate 70. Since the substrate 10A is formed on the structure shown in FIG. 6A, then is cut along the cutting lines D1 using a dicing blade or the like, and becomes the heat sink 10 shown in FIG. 1, as a material of the substrate 10A, in the same manner as the heat sink 10, a metal with favorable heat conductivity such as, for example, copper, aluminum, or iron, or an alloy including at least one of these metals may be used. As a material of the insulating layer 21, for example, an insulating resin such as a thermosetting epoxy resin or polyimide resin, or a resin material where a filler such as silica or alumina is mixed with the resin may be used. The insulating layer 21 uses one in a B-stage state (half cured state). The thickness of the insulating layer 21 may be, for example, about 50 μm to 80 μm.

Figure 6A:
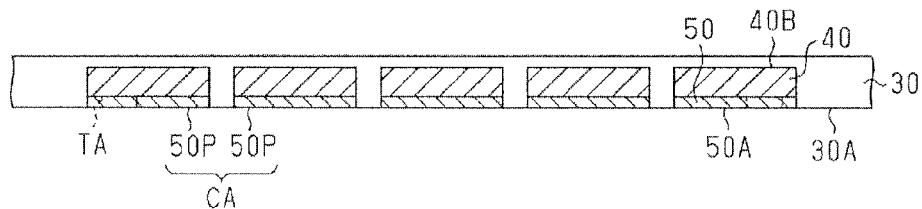
Figure 6B:
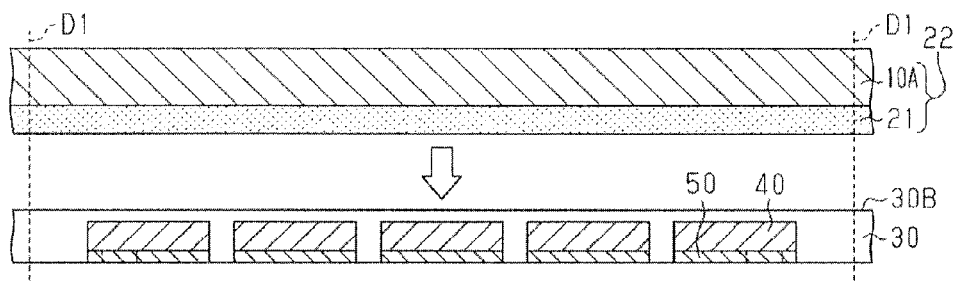

In addition, in the step shown in FIG. 6B, the structure 22 is disposed on the upper surface side of the structure shown in FIG. 6A. At this time, the structure 22 is disposed in a state where the insulating layer 21 faces downward such that the insulating layer 21 faces the second main surface 30B (the upper surface in FIG. 6B) of the reflective layer 30. In addition, the sheet-shaped structure 22 is formed on the second main surface 30B of the reflective layer 30 through thermocompression. Thereby, the insulating layer 21 and the substrate 10A are formed on the second main surface 30B of the reflective layer 30. Subsequently, the insulating layer 21 is cured by performing a heat curing treatment in an atmosphere of a temperature of about 150° C., thereby forming the insulating layer 20. When the insulating layer 21 is cured, the reflective layer 30 is adhered to the insulating layer 20, and the substrate 10A is adhered to the insulating layer 20. Thereby, the wiring patterns 40 are adhered to the substrate 10A via the insulating layer 20 and the reflective layer 30.

Figure 6C:
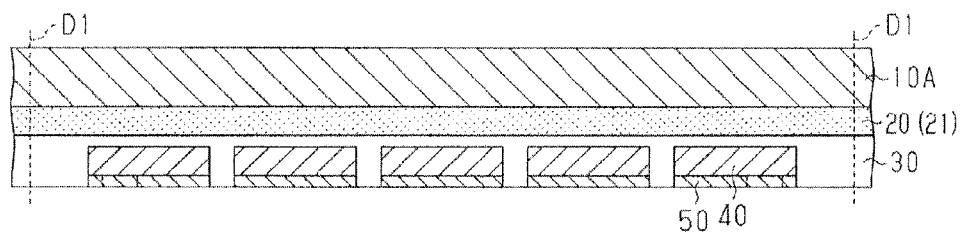
Figure 6D:
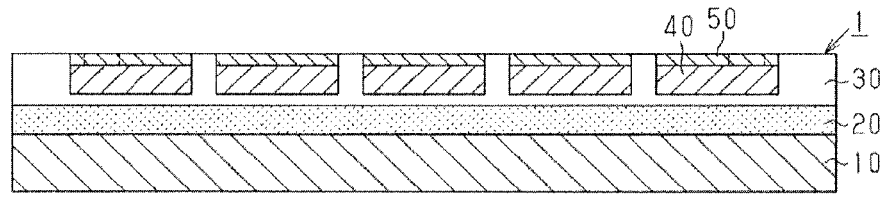

Next, in the step shown in FIG. 6C, the structure shown in the same figure is cut along the cutting lines D1. Thereby, as shown in FIG. 6D, the wiring substrate 1 according to the present embodiment is generated as a unit piece, thereby manufacturing a plurality of wiring substrates 1. In addition, in FIG. 6D, the structure shown in the same figure is shown so as to be vertically reverse to that shown in FIG. 6C.

(Manufacturing Method of Light Emitting Device)

Next, a manufacturing method of the light emitting device 2 will be described with reference to FIG. 7.

Figure 7A:
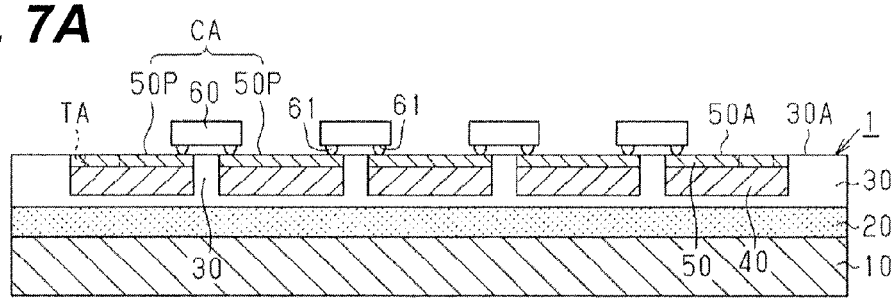

In the step shown in FIG. 7A, the light emitting element 60 is mounted on the pads 50P formed in each mounting region CA of the wiring substrate 1. Specifically, the bumps 61 of the light emitting element 60 are flip-chip bonded to the respective surfaces of the adjacent pads 50P. For example, in a case where the bumps 61 are gold bumps, the bumps 61 are fixed onto the metal layers 50 through ultrasonic bonding.

Figure 7B:
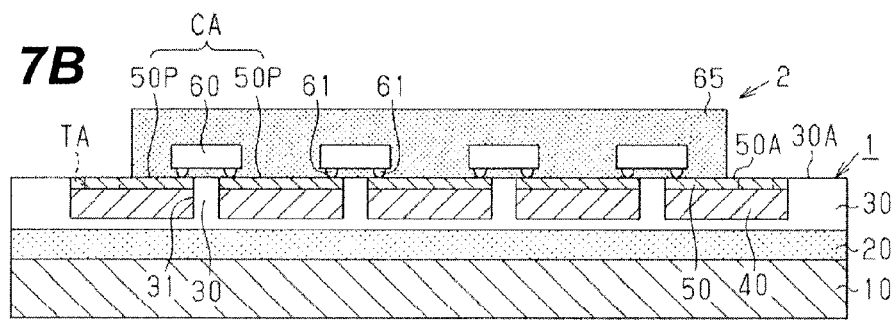

Next, in the step shown in FIG. 7B, the encapsulating resin 65 which encapsulates a plurality of light emitting elements 60 and the bumps 61 mounted on the wiring substrate 1 is formed. For example, in a case where a thermosetting resin is used as the encapsulating resin 65, the structure shown in FIG. 7A is accommodated in a mold, and pressure (for example, 5 MPa to 10 Mpa) is applied to the inside of the mold, thereby introducing a fluidized resin thereinto. Thereafter, the resin is heated at, for example, about 180° C. so as to be cured, thereby forming the encapsulating resin 65. In addition, the encapsulating resin 65 may be formed by potting a liquid resin. Through the above-described manufacturing steps, the light emitting device 2 shown in FIG. 2 is manufactured.

(Effects)

According to the above-described present embodiment, the following effects can be achieved.

(1) The first main surface 30A (the outermost surface) of the reflective layer 30 formed in the outermost surface of the mounting surface side where the light emitting element 60 is mounted is formed so as to be flush with the first main surface 50A (the outermost surface) of the metal layer 50 functioning as the pad 50P. Thereby, since the reflective layer 30 does not protrude further upward than the surface of the pad 50P, interference (contact) between the reflective layer 30 and the light emitting element 60 which is flip-chip bonded onto the pads 50P is appropriately suppressed. For this reason, even if the bumps 61 of the light emitting element 60 are made fine and thereby a gap between the light emitting element 60 and the pads 50P is narrowed, it is possible to appropriately suppress interference between the reflective layer 30 and the light emitting element 60. Therefore, the light emitting element 60 can be mounted using the fine bumps 61, and thereby it is possible to handle the miniaturization of the light emitting element 60.

From another viewpoint, in the wiring substrate 1, the mounting surfaces (the first main surface 30A of the reflective layer 30 and the first main surface 50A of the metal layer 50) where the light emitting element 60 is mounted are formed so as to be planarized. For this reason, for example, if the heights of the bumps 61 of the light emitting element 60 are the same, a gap between the wiring substrate 1 and the light emitting element 60 mounted on the wiring substrate 1 are substantially constant. As such, if the gap between the wiring substrate 1 and the light emitting element 60 mounted on the wiring substrate 1 are stable, it is possible to suppress interference between the reflective layer 30 and the light emitting element 60 even if the gap is narrowed. Therefore, it is possible to stably mount the light emitting element 60 having the fine bumps 61.

(2) The reflective layer 30 is also formed directly under the light emitting element 60 in addition to the peripheral region of the mounting regions CA. For this reason, it is possible to increase reflectance of light from the light emitting element 60 as compared with a case where the reflective layer 30 is not formed directly under the light emitting element 60. Therefore, it is possible to appropriately reduce light amount loss of the light emitting element 60.

(3) The metal layers 50 and the wiring patterns 40 are formed on the first main surface 70A of the supporting substrate 70 which is a planarized surface, the reflective layer 30 is formed so as to cover the metal layers 50 and the wiring patterns 40, and then the supporting substrate 70 is removed. Thereby, the first main surface 30A of the reflective layer 30 and the first main surfaces 50A of the metal layers 50 which come into contact with the first main surface 70A of the supporting substrate 70 are formed in a shape along the first main surface 70A (planarized surface). For this reason, it is possible to easily form the first main surface 30A of the reflective layer 30 and the first main surfaces 50A of the metal layers 50 so as to be planarized and to thereby easily form the first main surface 30A and the first main surfaces 50A so as to be flush with each other.

However, in a case where the insulating layer 20, the wiring patterns 40, and the metal layers 50 are sequentially formed on the heat sink 10, and the reflective layer 30 is formed so as to reliably cover the entire side surfaces of the wiring patterns 40 and the entire side surfaces of the metal layers 50, it is difficult to form the first main surfaces 50A of the metal layers 50 and the first main surface 30A of the reflective layer 30 so as to be flush with each other. Specifically, first, the reflective layer 30 is mainly made of a thermosetting insulating resin from the characteristics thereof and is thus formed using the screen printing method in many cases. However, in the screen printing method, positioning accuracy is lower than that of a photolithography method, and blurring tends to occur. For this reason, in order to reliably cover the entire side surfaces of the wiring patterns 40 and the entire side surfaces of the metal layers 50, thereby protecting the wiring patterns 40 and the metal layers 50, it is necessary to form the reflective layer 30 so as to cover a portion of the metal layers 50 in consideration of misalignment, blurring, or the like, and, since the screen printing method has lower thickness accuracy than a photolithography method or the like, if the reflective layer 30 is formed on the metal layers 50 as described above, a variation in the thickness of the reflective layer 30 occurs. Thereby, the reflective layer 30 and the light emitting element 60 tend to interfere with each other.

In contrast, according to the manufacturing method of the present embodiment, the reflective layer 30 cannot only be formed so as to cover the entire side surfaces of the wiring patterns 40 and the entire side surfaces of the metal layers 50 but the first main surface 30A of the reflective layer 30 and the first main surfaces 50A of the metal layers 50 can also be easily formed so as to be flush with each other. In addition, according to the manufacturing method, since the reflective layer 30 is not blurred onto the first main surfaces 50A of the metal layers 50, it is possible to form the metal layers 50 and the wiring patterns 40 in a desired pattern with high accuracy. Further, it is not necessary to form the reflective layer 30 so as to cover a portion of the first main surfaces 50A of the metal layer 50, and thus it is possible to improve a degree of freedom of design of the metal layers 50 and the wiring patterns 40.

(4) The reflective layer 30 is formed so as to cover the second main surfaces 40B of the wiring patterns 40 formed on the supporting substrate 70. Thereby, it is possible to eject a resin paste onto the entire first main surface 70A of the supporting substrate 70. For this reason, even if the reflective layer 30 is formed using the screen printing method, it is possible to form the reflective layer 30 on the first main surface 70A of the supporting substrate 70 in no consideration of misalignment or blurring which is problematic in the screen printing method. Therefore, even if a gap between the wiring patterns 40 and a gap between the metal layers 50 are narrowed, it is possible to easily form the reflective layer 30 between the wiring patterns 40 and between the metal layers 50.

(5) After the metal layers 50 and the wiring patterns 40 are formed on the first main surface 70A of the supporting substrate 70 using the electrolytic plating method, the reflective layer 30 which covers the metal layers 50 and the wiring patterns 40 is formed. In this case, since the reflective layer 30 is not formed when the metal layers 50 and the wiring patterns 40 are formed using the electrolytic plating method, it is possible to prevent in advance deterioration in a plating solution due to the presence of the reflective layer 30. Thereby, it is possible to increase the solution lifetime of the plating solution and to thereby continuously use the plating solution. As a result, it is possible to contribute to cost reduction.

Other Embodiments

In addition, the above-described embodiment may be performed in the following aspects by appropriately modifying the embodiment.

In the above-described embodiment, the entire second main surfaces 40B of the wiring patterns 40 are covered with the reflective layer 30. The present invention is not limited thereto, and, the second main surfaces 40B of the wiring patterns 40 may be exposed from the reflective layer 30, and thereby the entire second main surfaces 40B may come into contact with the insulating layer 20. An example of the method of manufacturing a wiring substrate with this structure will be described below.

Figure 8A:
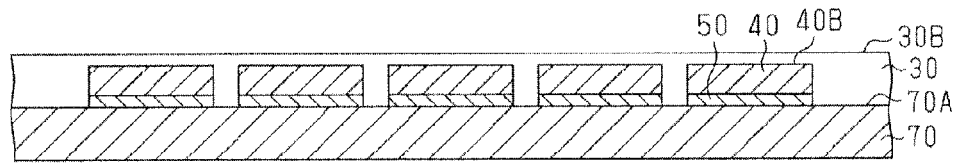
Figure 8B:
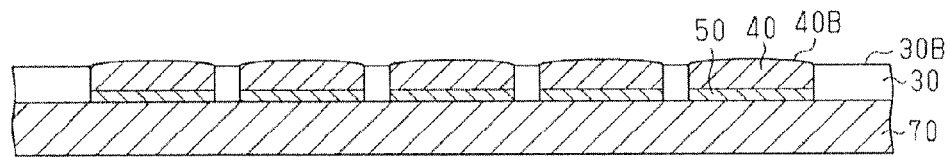

Specifically, as shown in FIG. 8A, in the same manner as the previous steps shown in FIGS. 4 and 5, the reflective layer 30 which covers the entire side surfaces of the metal layers 50, the entire side surfaces of the wiring patterns 40, and the entire second main surfaces 40B of the wiring patterns 40 is formed on the first main surface 70A of the supporting substrate 70. Next, in the step shown in FIG. 8B, the second main surface 30B side of the reflective layer 30 is polished or ground. Specifically, by polishing or grinding and thus removing the reflective layer 30 which is formed so as to cover the second main surfaces 40B of the wiring patterns 40, the second main surfaces 40B of the wiring patterns 40 are exposed from the reflective layer 30. In other words, in this step, the second main surface 30B of the reflective layer 30 is polished or ground until the second main surfaces 40B of the wiring patterns 40 are exposed. In addition, the polishing may use, for example, buff grinding. However, in the buff grinding, a processing rate is different depending on malleability of a material to be processed. Specifically, in the buff grinding, a processing rate is great in a material having the relatively high brittleness (a cured resin or the like), and a processing rate is small in a material (for example, metal) having the relatively low brittleness. In addition, if the second main surface 30B side of the reflective layer 30 is buff-polished until the second main surfaces 40B of the wiring patterns 40 are reliably exposed, the second main surfaces 40B of the wiring patterns 40 are exposed from the reflective layer 30 so as to rise like a mountain due to the difference between the processing rates as described above, as shown in FIG. 8B.

Figure 8C:
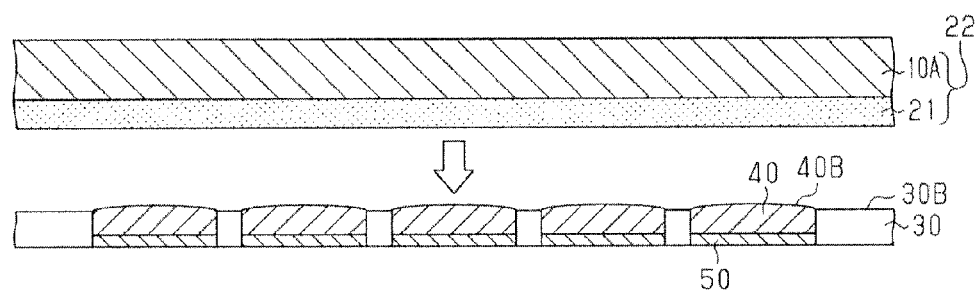
Figure 8D:
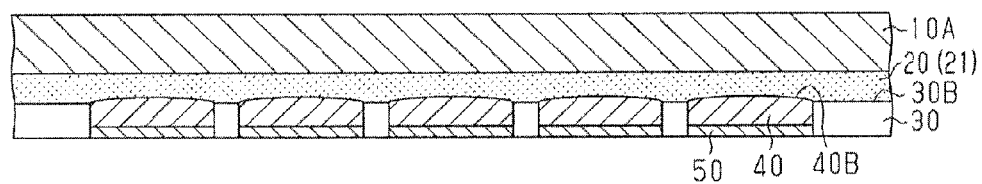

Next, after the supporting substrate 70 which is used as a temporary substrate is removed through wet etching or the like, the structure 22 where the insulating layer 21 is adhered to the substrate 10A is disposed over the structure after the removal as shown in FIG. 8C. In addition, the sheet-shaped structure 22 is formed on the second main surface 30B of the reflective layer 30 and the second main surfaces 40B of the wiring patterns 40 through thermocompression. Through the thermocompression at this time, as shown in FIG. 8D, the wiring patterns 40 exposed from the reflective layer 30 are pushed into the insulating layer 21. Thereby, the entire second main surface 30B of the reflective layer 30 and the entire second main surfaces 40B of the wiring patterns 40 are covered with the insulating layer 21. Thereafter, the insulating layer 21 is cured in an atmosphere of a temperature of about 150° C., thereby forming the insulating layer 20.

According to this structure, the wiring patterns 40 directly come into contact with the insulating layer 20 which is made of a material with high heat conductivity. For this reason, heat generated by the light emitting element 60 can be conducted to the insulating layer 20 from the wiring patterns 40 with efficiency, and heat generated by the light emitting element 60 can be conducted to the heat sink 10 with efficiency. Therefore, it is possible to improve heat dissipation performance of the light emitting device 2. As a result, since temperature of the light emitting element 60 can be suppressed from increasing, it is possible to appropriately suppress reduction in emission efficiency of the light emitting element 60.

In addition, if the second main surfaces 40B of the wiring patterns 40 are exposed from the reflective layer 30 through the buff grinding as described above, the second main surfaces 40B of the wiring patterns 40 are formed in a mountain shape. For this reason, it is possible to increase the contact area between the wiring patterns 40 and the insulating layer 20 as compared with a case where the second main surfaces 40B of the wiring patterns 40 are planarized surfaces. Thereby, it is possible to increase a heat conduction amount from the wiring patterns 40 to the insulating layer 20 and to thereby conduct heat generated by the light emitting element 60 to the heat sink 10 with efficiency. Therefore, it is possible to further improve the heat dissipation performance of the light emitting device 2.

In addition, the polishing or grinding is not limited to the buff grinding, and, for example, a blast process, byte grinding where grinding is performed using a grinding edge (tool) made of tungsten carbide or diamond, or the like, may be used.

Figure 9A:
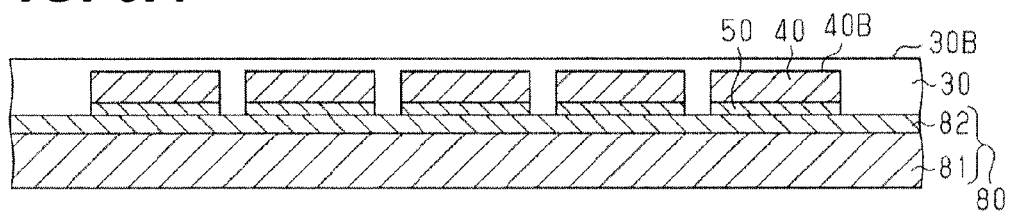
Figure 9B:
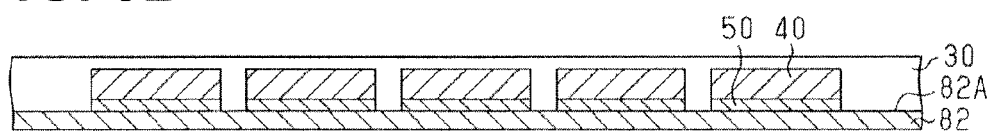
Figure 9C:
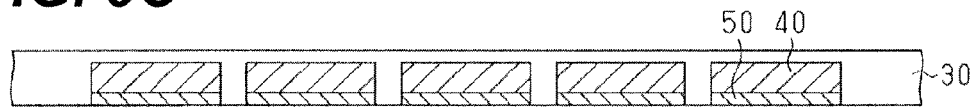

In the above-described embodiment, the supporting substrate 70 formed of a copper plate is used as a temporary substrate in the manufacturing steps. The present invention is not limited thereto, and, as shown in FIG. 9A, metal foil with a carrier where a very thin metal foil 82 is formed on one surface side of a carrier layer 81 via a release sheet (peeling layer) (not shown) may be used as a supporting substrate 80 instead of the supporting substrate 70. The metal foil 82 may use a copper foil. The thickness of the metal foil 82 may be, for example, about 1 µm to 5 µm. As a material of the carrier layer 81, for example, copper or a copper alloy may be used. The carrier layer 81 is thicker than the metal foil 82, and the thickness thereof may be, for example, about 30 µm to 50 µm. The carrier layer 81 functions as a supporting member for securing the mechanical strength of the structure in the manufacturing steps, and also functions as a member for carrying the metal foil 82 which is difficult to handle. As a release sheet interposed between the carrier layer 81 and the metal foil 82, for example, a silicon release sheet or a fluorine release sheet may be used. In a case of removing the supporting substrate 80, first, the carrier layer 81 is mechanically peeled, and thereby a structure where the metal layers 50, the wiring patterns 40, the reflective layer 30 covering them are formed on the first main surface 82A of the metal foil 82 is obtained, as shown in FIG. 9B. Next, the metal foil 82 is removed through wet etching or the like, thereby removing the supporting substrate 80 from the structure shown in FIG. 9A as shown in FIG. 9C. If the supporting substrate 80 is used, most (the carrier layer 81) of the supporting substrate 80 can be peeled mechanically, and thus it is possible to reduce time required for chemical removal such as wet etching. Further, it is possible to reduce time for removing the entire supporting substrate 80 and to thereby contribute to cost reduction.

Figure 10A:
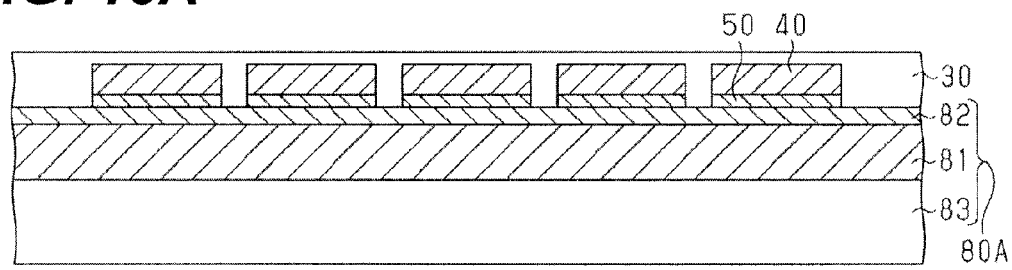
Figure 10B:
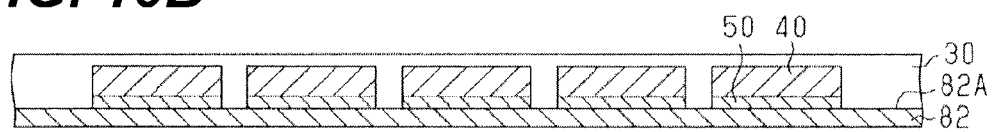

Alternatively, for example, as shown in FIG. 10A, a structure where a very thin metal foil 82 is formed on one surface side of a carrier layer 81 via a release sheet (peeling layer) (not shown) and a core substrate 83 is formed on the other surface side of the carrier layer 81 may be used as a supporting substrate 80A instead of the supporting substrate 70. As a material of the core substrate 83, for example, a glass epoxy resin or the like may be used. The thickness of the core substrate 83 may be, for example, about 0.5 mm to 2.0 mm. In a case of removing the supporting substrate 80A, first, the core substrate 83 and the carrier layer 81 are mechanically peeled, and thereby a structure where the metal layers 50, the wiring patterns 40, the reflective layer 30 covering them are formed on the first main surface 82A of the metal foil 82 is obtained, as shown in FIG. 10B. Next, the metal foil 82 is removed through wet etching or the like, thereby removing the supporting substrate 80A from the structure shown in FIG. 10A. If the supporting substrate 80A is used, most (the carrier layer 81 and the core substrate 83) of the supporting substrate 80A can be peeled mechanically, and thus it is possible to reduce time for removing the entire supporting substrate 80A. Further, it is possible to improve the mechanical strength of the structure of the manufacturing steps by the core substrate 83.

In the above-described embodiment, after forming the reflective layer 30 which covers the metal layers 50 and the wiring patterns 40 on the first main surface 70A of the supporting substrate 70, the supporting substrate 70 is removed. The present invention is not limited thereto, and, the supporting substrate 70 may be removed after forming a structure corresponding to the wiring substrate 1 on the first main surface 70A of the supporting substrate 70. For example, in a case where the reflective layer 30 is relatively thick (for example, 50 µm or more), since the mechanical strength of a structure (the structure shown in FIG. 6A) after removing the supporting substrate 70 can be sufficiently secured, the structure 22 (refer to FIG. 6B) can be easily formed. However, in a case where the reflective layer 30 is relatively thin (for example, about 20 µm to 40 µm), the mechanical strength of a structure (the structure shown in FIG. 6A) after removing the supporting substrate 70 is insufficient, and thus the structure 22 cannot be stably formed. Therefore, as shown in FIG. 11, after the metal layers 50, the wiring patterns 40, and the reflective layer 30 covering them are formed on the first main surface 70A of the supporting substrate 70, the structure 22 may be formed without removing the supporting substrate 70.

Figure 11A:
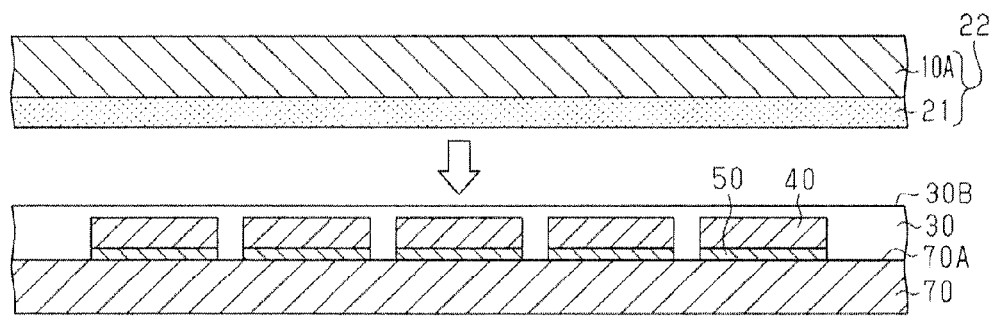
Figure 11B:
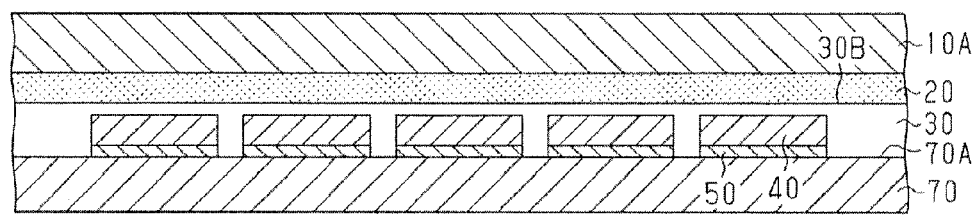
Figure 11C:
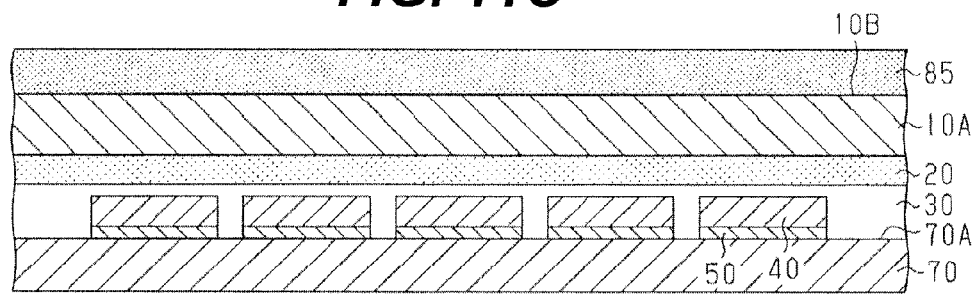
Figure 11D:
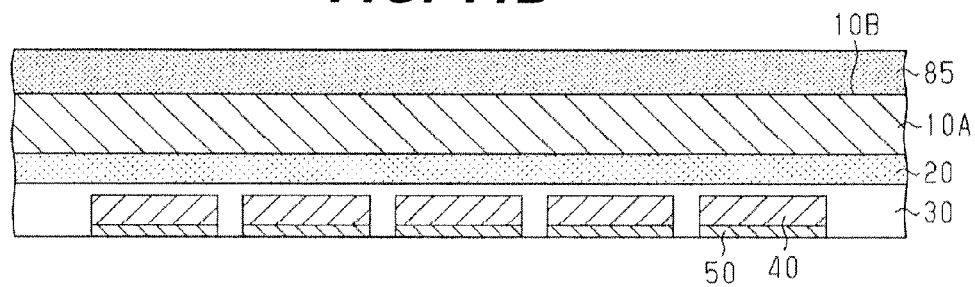

Specifically, in the step shown in FIG. 11A, the structure 22 formed of the substrate 10A and the insulating layer 21 is disposed over the structure shown in FIG. 5C. The sheet-shaped structure 22 is formed on the second main surface 30B of the reflective layer 30 through thermocompression and is cured. Thereby, the insulating layer 20 and the substrate 10A are formed on the second main surface 30B of the reflective layer 30. Next, in the step shown in FIG. 11C, a resist layer 85 which covers the entire first main surface 10B (the upper surface in FIG. 11C) of the substrate 10A is formed. The thickness of the resist layer 85 is sufficient as long as the resist layer 85 covers the entire first main surface 10B so as to prevent the first main surface 10B of the substrate 10A from being etched in the subsequent step, and may be, for example, about 0.02 mm to 0.05 mm. In addition, as a material of the resist layer 85, an etching resistant material may be used. Specifically, as a material of the resist layer 85, a photosensitive dry film resist, a liquid photoresist (for example, a dry film resist or a liquid resist of a Novolac resin, an acryl resin, or the like), and the like may be used. Next, in the step shown in FIG. 11D, in the same manner as the step shown in FIG. 6A, the supporting substrate 70 (refer to FIG. 11C) which is used as a temporary substrate is removed. Thereafter, the resist layer 85 is removed by, for example, an alkaline stripping agent, and thereby a structure corresponding to the wiring substrate 1 is formed in each wiring substrate forming region C1 of the substrate 10A.

In addition, although, in the above-described modified example, the resist layer 85 is formed before removing the supporting substrate 70, formation of the resist layer 85 may be omitted. For example, in a case of using the supporting substrates 80 and 80A instead of the supporting substrate 70, since the thickness of the metal foil 82 which is removed chemically through wet etching or the like is very small (about 1 µm to 5 µm), the heat sink 10 is removed only by an extent of several % of the overall thickness even if forming of the resist layer 85 is omitted in this case. For this reason, forming of the resist layer 85 can be omitted in this case.

In the above-described embodiment, the resist layer 71 having the openings 71X is formed on the first main surface 70A of the supporting substrate 70, the metal layers 50 and the wiring patterns 40 are formed on the first main surface 70A exposed from the openings 71X, and then the reflective layer 30 which covers the metal layers 50 and the wiring patterns 40 is formed. The present invention is not limited thereto, and, for example, a reflective layer having openings with the same shape as the openings 71X may be formed on the first main surface 70A of the supporting substrate 70, and the metal layers 50 and the wiring patterns 40 may be formed on the first main surface 70A exposed from the openings of the reflective layer. In addition, a material of the reflective layer in this case is required to have plating resistance.

Figure 12A:
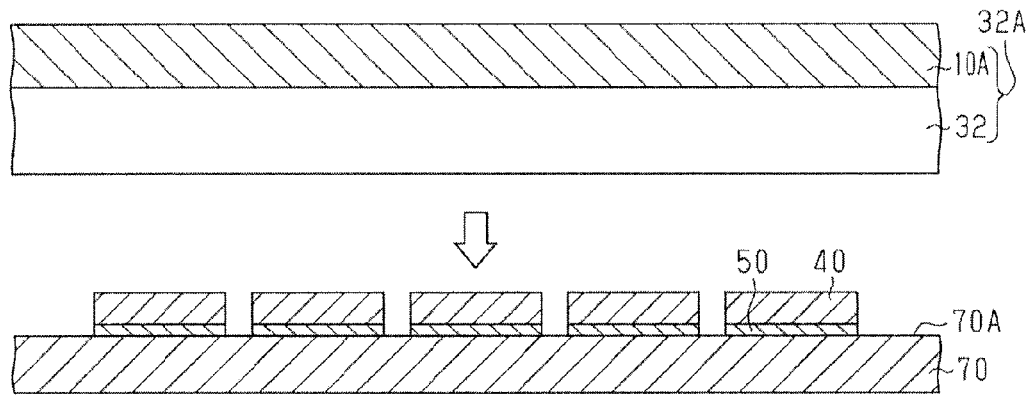
FIGS. 12A to 12C are schematic cross-sectional views illustrating manufacturing steps of a wiring substrate according to a modified example of the embodiment, wherein FIGS.

The insulating layer 20 in the above-described embodiment may be omitted. In this case, the wiring substrate may be manufactured according to, for example, the following manufacturing method. Specifically, as shown in FIG. 12A, a structure 32A where a sheet-shape reflective layer 32 is adhered to the substrate 10A is disposed over a structure where the metal layers 50 and the wiring patterns 40 are formed on the first main surface 70A of the supporting substrate 70. At this time, the structure 32A is disposed in a state where the reflective layer 32 faces downward such that the reflective layer 32 faces the wiring patterns 40 and the supporting substrate 70. As a material of the reflective layer 32, for example, a white insulating resin which has high reflectance and a thermosetting property may be used. In addition, a material of the reflective layer 32 is preferably an insulating resin having the high heat conductivity from the viewpoint of heat dissipation. Further, as the white insulating resin, for example, a resin material where a filler or a pigment formed from white titanium oxide or barium sulfate is contained in an epoxy resin or a silicon resin may be used. In addition, the reflective layer 32 uses one in a B-stage state. The thickness of the reflective layer 32 may be a thickness capable of covering, for example, the metal layers 50 and the wiring patterns 40, and may be, for example, about 20 μm to 130 μm.

Figure 12B:
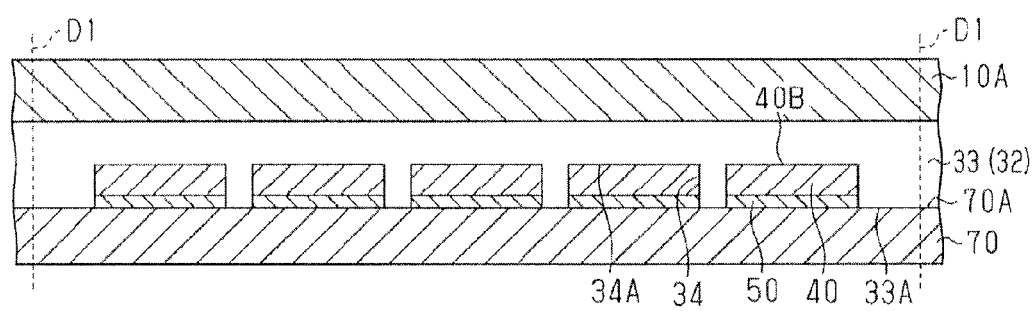

In addition, the sheet-shaped structure 32A is formed on the first main surface 70A of the supporting substrate 70 through thermocompression. Through the thermocompression at this time, as shown in FIG. 12B, the wiring patterns 40 and the metal layers 50 are pushed into the reflective layer 32. Thereby, the first main surface 70A of the supporting substrate 70, the entire side surfaces of the wiring patterns 40, the entire side surfaces of the metal layers 50, and the entire second main surfaces 40B of the wiring patterns 40 are covered with the reflective layer 32. Thereafter, the reflective layer 32 is cured by performing a heat curing treatment in an atmosphere of a temperature of about 150° C., thereby forming a reflective layer 33. In addition, through this step, recessed portions 34 which accommodate the wiring patterns 40 and the metal layers 50 are formed in the first main surface 33A of the reflective layer 33, and the wiring patterns 40 are formed on the bottom surfaces 34A of the recessed portions 34.

According to the manufacturing method, the wiring patterns 40 and the metal layers 50 are pushed in the reflective layer 32, and the reflective layer 33 which covers the wiring patterns 40 and the metal layers 50 is formed. For this reason, according to the manufacturing method, even if a gap between the wiring patterns 40 and a gap between the metal layers 50 are narrowed, the reflective layer 33 can be easily formed between the wiring patterns 40 and between the metal layers 50. In addition, the reflective layer 32 is formed in the vacuum atmosphere, and thereby it is possible to suppress void from being involved into the reflective layer 32.

Figure 12C:
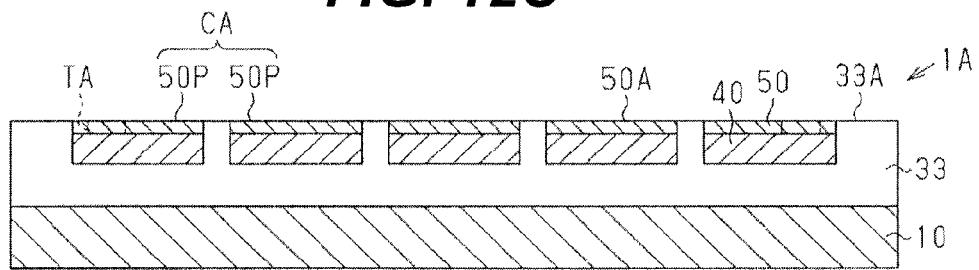

Thereafter, the supporting substrate 70 is removed through etching, the substrate 10A and the like are cut along the cutting lines D1 so as to be generated as a unit piece, and thereby a wiring substrate 1A as shown in FIG. 12C can be obtained. In the wiring substrate 1A, the first main surface 33A (the outermost surface) of the reflective layer 33 which is formed on the outermost surface of the mounting surface side of the light emitting element 60 is formed so as to be flush with the first main surfaces (the outermost surfaces) 50A of the metal layers 50. In addition, in the wiring substrate 1A, the insulating layer 20 is omitted, and thus the reflective layer 33 has functions of adhering the heat sink 10 to the wiring patterns 40 and of insulating the heat sink 10 from the wiring patterns 40. Further, in the wiring substrate 1A, since the insulating layer 20 is omitted, the resin layer interposed between the wiring patterns 40 and the heat sink 10 can be made to be thin, and thus it is possible to improve a heat dissipation performance.

In addition, for example, as shown in FIG. 13A, the reflective layer 33 may be formed so as to cover the metal layers 50 and the wiring patterns 40 formed on the first main surface 70A of the supporting substrate 70, and the substrate 10A may be formed on the reflective layer 33. Even in this case, as shown in FIG. 13B, the reflective layer 33 is formed so as to cover the entire side surfaces of the metal layers 50, the entire surfaces of the wiring patterns 40, and the entire second main surfaces 40B of the wiring patterns 40. In addition, the first main surface 33A (the outermost surface) of the reflective layer 33 which is formed on the outermost surface of the mounting surface side of the light emitting element 60 is formed so as to be flush with the first main surfaces (the outermost surfaces) 50A of the metal layers 50. That is, even using this manufacturing method, it is possible to manufacture the wiring substrate having the same structure as that of the wiring substrate 1A shown in FIG. 12C. Further, the reflective layer 33 in this case may be formed according to, for example, a screen printing method or a roll covering method using a resin paste.

In addition, for example, as shown in FIG. 14, the structure 32A where the sheet-shaped reflective layer 32 made of the same material as that of the reflective layer 30 is adhered to the substrate 10A may be formed on a structure where the reflective layer 30 covering the metal layers 50 and the wiring patterns 40 is formed on the first main surface 70A of the supporting substrate 70. Specifically, as shown in FIG. 14A, the sheet-shaped structure 32A is formed on the second main surface 30B of the reflective layer 30 through thermocompression. Thereby, the reflective layer 32 and the substrate 10A are formed on the second main surface 30B of the reflective layer 30. Thereafter, the reflective layer 32 is cured by performing a heat curing treatment in an atmosphere of a temperature of about 150° C., thereby forming the reflective layer 33. Even in the structure and the manufacturing method, it is possible to achieve the same effects as in (1) to (5) of the first embodiment.

Although, in the above-described embodiment, the sheet-shaped insulating resin is used as a material of the insulating layer 21 which becomes the insulating layer 20, a liquid or paste insulating resin may be used as a material of the insulating layer 21. Although, in the modified examples described with reference to FIGS. 12 and 14, the sheet-shaped insulating resin is used as a material of the reflective layer 32 which becomes the reflective layer 33, a liquid or paste insulating resin may be used as a material of the reflective layer 32.

Figure 15A:
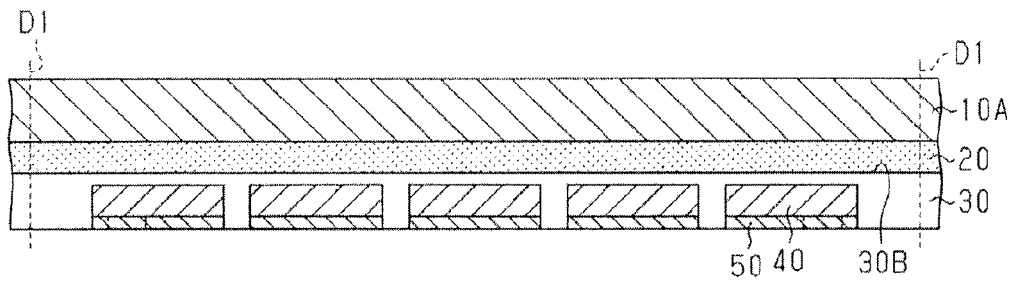
Figure 15B:
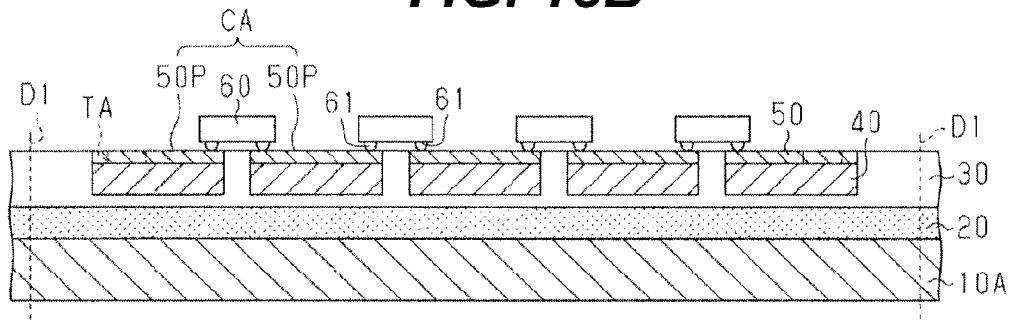
Figure 15C:
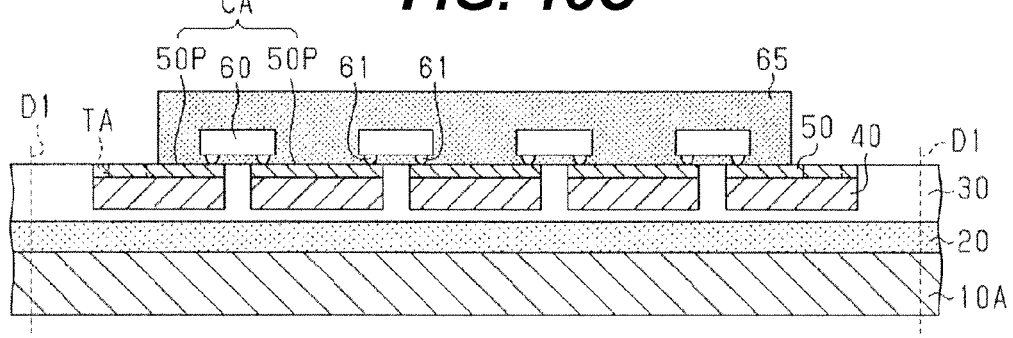
Figure 15D:
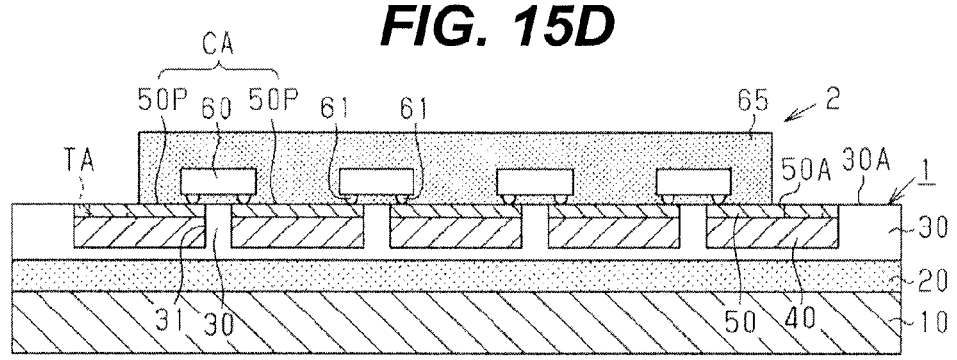

In the above-described embodiment, the wiring substrate 1 is formed as a unit piece, and then the light emitting element 60 is mounted on the pads 50P of the wiring substrate 1. The present invention is not limited thereto, and, as shown in FIG. 15, the light emitting element 60 may be mounted on the pads 50P before the wiring substrate 1 is formed as a unit piece, and then cutting may be performed along the cutting lines D1, thereby obtaining each light emitting device 2. Specifically, as shown in FIG. 15A, after the insulating layer 20 and the substrate 10A are formed on the second main surface 30B of the reflective layer 30, the light emitting element 60 is mounted on the pads 50P as shown in FIG. 15B without cutting along the cutting lines D1. In addition, in FIG. 15B, the structure shown in the same figure is shown so as to be vertically reverse to that shown in FIG. 15A. Next, as shown in FIG. 15C, after the light emitting elements 60 are encapsulated with the encapsulating resin 65, cutting may be performed along the cutting lines D1, thereby obtaining each light emitting device 2 as shown in FIG. 15D. In addition, the encapsulating resin 65 may be formed for the respective partitions where the wiring substrate forming regions C1 are formed in a matrix (in FIG. 3, 3×3) using a collective molding method, or may be formed for each wiring substrate forming region C1 using a separate molding method.

In the above-described embodiment, the reflective layer 30 is formed using the screen printing method. The present invention is not limited thereto, and, for example, the reflective layer 30 may be formed using a roll covering method. In addition, the reflective layer 30 may be formed by applying a liquid resin using a dispenser.

In the light emitting element 60 of the above-described embodiment, one bump 61 is flip-chip bonded to one pad 50P of the two pads 50P formed in each mounting region CA, and the other bump 61 is flip-chip bonded to the other pad 50P. The present invention is not limited thereto, and, for example, a plurality of bumps 61 may be flip-chip bonded to one pad 50P, and a plurality of bumps 61 may be flip-chip bonded to the other pad 50P.

However, in a case where a single bump 61 is bonded to a single pad 50P, a connection location on each pad 50P is only one, and thus there is concern that the light emitting element 60 mounted on the wiring substrate 1 may be tilted. In contrast, in the structure according to the modified example, a plurality of bumps 61 are bonded to a single pad 50P, and thus there are a plurality of connection locations on each pad 50P. Thereby, it is possible to stably mount the light emitting element 60 on the wiring substrate 1.

In the above-described embodiment, a plurality of light emitting elements 60 mounted on the wiring substrate 1 are collectively encapsulated with the encapsulating resin 65. The present invention is not limited thereto, and the light emitting element 60 mounted in each mounting region CA may be encapsulated separately with an encapsulating resin.

A shape of the mounting region CA and the terminal region TA in the above-described embodiment is not limited to a circular shape, and may be, for example, a polygonal shape such as a rectangular shape or a pentagonal shape, a semicircular shape, an elliptical shape, or a semi-elliptical shape.

The above-described embodiment is implemented using the multi-piece manufacturing method, but may be implemented using a single-piece manufacturing method. In other words, a base material (a supporting substrate or a heat sink) with the size corresponding to a single wiring substrate 1 may be used instead of the multi-piece supporting substrate 70 and the substrate 10A, and the wiring substrate 1 and the light emitting device 2 may be manufactured.

A planar shape of each of the wiring substrate 1 and the light emitting device 2 in the above-described embodiment is not limited to a rectangular shape, and may be, for example, a polygonal shape such as a triangular shape or a pentagonal shape, or a circular shape.

The number or arrangement of the light emitting elements 60 mounted on the wiring substrate 1 in the above-described embodiment is not particularly limited.

A shape of the wiring pattern 40 and the metal layer 50 in the above-described embodiment is not particularly limited. For example, there may be a modification to a metal layer with a pattern as shown in FIG. 16A. In other words, a plurality of metal layers 55 with an approximately rectangular shape in plan view may be disposed in an approximately W shape in plan view. In this case, a groove-shape opening 55X extending in the vertical direction of the figure is formed between the metal layers 55 which are adjacent to each other in the horizontal direction of the figure. In addition, a strip-shaped opening 55Y extending in the horizontal direction of the figure is formed between the metal layers 55 which are adjacent to each other in the vertical direction of the figure. A plurality of metal layers 55 are separated from each other by the openings 55X and 55Y. The metal layers 55 have mounting regions CA arranged in a matrix (here, 4×4). In addition, the metal layers 55 have a pair of terminal regions TA functioning as electrode terminals. The pair of terminal regions TA are respectively formed on the metal layers 55 which are positioned at the start point and end point of the W shape among a plurality of metal layers 55 arranged in an approximately W shape. In a case where the light emitting elements 60 are mounted on a wiring substrate provided with the metal layers 55 and the terminal regions TA, a plurality of (here, sixteen) light emitting elements are connected in series between one terminal region TA and the other terminal region TA.

Alternatively, there may be a modification to a metal layer as shown in FIG. 16B. In other words, a metal layer 56 with an approximately strip shape in plan view may be disposed, and a plurality of metal layers 57 with an approximately rectangular shape in plan view, disposed in parallel to the metal layer 56 so as to be adjacent to each other, may be disposed in a matrix (in this embodiment, matrix of 6×2). That is, the metal layer 56 is commonly provided with respect to the adjacent metal layers 57 of two rows. In this case, groove-shaped openings 57X extending in the vertical direction of the figure are formed between the metal layers 56 and 57 and between the respective metal layers 57 which are adjacent to each other in the horizontal direction of the figure. In addition, strip-shaped openings 57Y extending in the horizontal direction of the figure are formed between the metal layers 57 which are adjacent to each other in the vertical direction of the figure. The metal layers 56 and 57, and the metal layers 57 are respectively separated from each other by the openings 57X and 57Y. The metal layers 56 and 57 have mounting regions CA arranged in a matrix (in this embodiment, matrix of 6×6). In addition, the metal layers 57 have a pair of terminal regions TA functioning as electrode terminals. The pair of terminal regions TA are formed in two metal layers 57 which is the farthest from the metal layer 56. In a case where light emitting elements 60 are mounted on a wiring substrate provided with the metal layers 56 and 57 and the terminal regions TA, the light emitting elements arranged in a matrix (in this embodiment, matrix of 6×3) are connected in series and in parallel between the metal layer 56 and one terminal region TA. In addition, the light emitting elements arranged in a matrix are connected in series and in parallel between the metal layer 56 and the other terminal region TA. Further, the light emitting element groups connected in series and in parallel are connected in series.

Alternatively, there may be a modification to a metal layer as shown in FIG. 17. In other words, a pair of metal layers 58 with an approximately comb shape in plan view may be formed. Specifically, the metal layer 58 has an electrode portion 58A which is formed in a rectangular shape in plan view and has a terminal region TA, and a plurality of (in FIG. 17, two) extending portions 58B with a comb-teeth shape extending inward from the electrode portion 58A. The pair of metal layers 58 are disposed such that the mutual extending portions 58B are alternately arranged. In this case, an opening 58X with an approximately Z shape in plan view is formed between the metal layers 58. The pair of metal layers 58 are separated from each other by the opening 58X. The metal layers 58 have mounting regions CA arranged in a matrix (in this embodiment, matrix of 3×2). In a case where light emitting elements 60 are mounted on a wiring substrate provided with the metal layers 58 and the terminal regions TA, each light emitting element 60 is flip-chip mounted on the extending portions 58B (the metal layers 58) formed on both the sides of the opening 58X in each of the mounting regions CA so as to cross over the opening 58X. Thereby, a plurality of light emitting elements 60 are connected in series and in parallel between one terminal region TA and the other terminal region TA.

(Application Example of Light Emitting Device)

FIG. 18 shows a cross-sectional view when the light emitting device 2 according to the embodiment is applied to an illumination apparatus 3.

The illumination apparatus 3 includes the light emitting device 2, a mounting board 100 having the light emitting device 2 mounted thereon, and an apparatus main body 120 in which the mounting board 100 is installed. In addition, the illumination apparatus 3 includes a cover 130 which is installed in the apparatus main body 120 and covers the light emitting device 2, a holder 140 which holds the apparatus main body 120, and a lighting circuit 150 which is fitted to the holder 140 and turns on the light emitting elements 60.

The apparatus main body 120 is formed in an approximately truncated conical shape in plan view. The apparatus main body 120 has a cross section 120A with a large diameter in which the mounting board 100 and the cover 130 are installed, and a cross section 120B with a small diameter. The apparatus main body 120 is made of, for example, aluminum or the like having good heat conductivity. The mounting board 100 is installed in the cross section 120A of the apparatus main body 120 using well-known installation means (in this embodiment, screws). In addition, the apparatus main body 120 is provided with a through-hole 120X which penetrates between the cross section 120A and the cross section 120B. Wires 160 which are electrically connected to the light emitting elements 60 of the light emitting device 2 via the mounting board 100 are disposed in the through-hole 120X. The wires 160 are lead to the cross section 120B side from the cross section 120A side via the through-hole 120X.

The cover 130 formed in an approximately dome shape in exterior view is fixed to the cross section 120A of the apparatus main body 120 by an adhesive such as a silicon resin such that the inside of the cover 130 is in an airtight state. In addition, the cover 130 is made of, for example, hard glass.

The holder 140 is made of, for example, a polybutylene terephthalate (PBT) resin or a polyethersulfone (PES) resin. The holder 140 is installed in the cross section 120B of the apparatus main body 120 using well-known installation means (an adhesive, a screw, or the like). A socket (not shown) is fitted to the holder 140. The lighting circuit 150 is accommodated inside the holder 140 and the socket. For example, a circuit board (not shown) of the lighting circuit 150 on which circuit components are mounted is attached to the holder 140. The lighting circuit 150 is a circuit which converts an AC voltage supplied from the socket into a DC voltage, and supplies the DC voltage to the light emitting elements 60 via the wires 160 such that the light emitting elements 60 emit light.

Next, detailed examples where the light emitting device 2 is mounted on the mounting board 100 will be described.

(Mounting Example 1 of Light Emitting Device)

FIG. 19A shows a cross-sectional view when the light emitting device 2 is mounted on a mounting board 100A.

The mounting board 100A includes a metal plate 101, an insulating layer 102 formed on the upper surface of the metal plate 101, and a wiring pattern 103 formed on the upper surface of the insulating layer 102. As a material of the metal plate 101, a metal with favorable heat conductivity such as, for example, aluminum and copper may be used. As a material of the insulating layer 102, for example, an insulating resin such as a polyimide resin or an epoxy resin, or a resin material where a filler such as silica or alumina is mixed with the resin may be used. As a material of the wiring pattern 103, for example, copper or a copper alloy may be used.

An opening 102X which exposes a part of the metal plate 101 as a mounting region of the light emitting device 2 is formed in the insulating layer 102. In addition, the light emitting device 2 is mounted in the mounting region, that is, on the metal plate 101 exposed from the opening 102X. Specifically, in the light emitting device 2, the heat sink 10 formed on the lower surface thereof is thermally bonded onto the metal plate 101 by a heat conduction member 104. In addition, the heat conduction member 104 may use, for example, a heat conduction member where a high heat conductivity substance such as, for example, indium (In), silicon (or hydrogen carbide) grease, a metal filler, or a graphite is produced in a sheet form with a resin binder.

In addition, the metal layers 50 of the terminal regions TA of the light emitting device 2 mounted on the mounting board 100A are electrically connected to the wiring patterns 103 of the mounting board 100A via spring-like connection terminals 105 (in this embodiment, lead pins).

According to this structure, since the heat sink 10 of the light emitting device 2 is bonded onto the metal plate 101 of the mounting board 100A, heat generated from the light emitting device 2 can be dissipated to the metal plate 101.

(Mounting Example 2 of Light Emitting Device)

FIG. 19B shows a cross-sectional view illustrating a state that the light emitting device 2 is mounted on a mounting board 100B.

The mounting board 100B includes a metal plate 111, an insulating layer 112 formed on the upper surface of the metal plate 111, and a wiring pattern 113 formed on the upper surface of the insulating layer 112. As a material of the metal plate 111, a metal with favorable heat conductivity such as, for example, aluminum and copper may be used. As a material of the insulating layer 112, for example, an insulating resin such as a polyimide resin or an epoxy resin, or a resin material where a filler such as silica or alumina is mixed with the resin may be used. As a material of the wiring pattern 113, for example, copper or a copper alloy may be used.

The light emitting device 2 is mounted on the wiring pattern 113. Specifically, in the light emitting device 2, the heat sink 10 formed on the lower surface thereof is thermally bonded onto the wiring pattern 113 by a heat conduction member 114. In addition, the heat conduction member 114 may use, for example, a heat conduction member where a high heat conductivity substance such as, for example, indium, silicon (or hydrogen carbide) grease, a metal filler, or a graphite is formed in a sheet shape with a resin binder.

In addition, the metal layers 50 of the terminal regions TA of the light emitting device 2 mounted on the mounting board 100B are electrically connected to the wiring patterns 113 of the mounting board 100B via bonding wires 115.

According to this structure, since the heat sink 10 of the light emitting device 2 is thermally bonded to the wiring pattern 113 via the heat conduction member 114, heat generated from the light emitting device 2 can be dissipated to the metal plate 111 from the heat sink 10 via the wiring pattern 113 and the insulating layer 112. In other words, the wiring pattern 113 which is thermally bonded to the heat sink 10 of the wiring patterns 113 functions as a wiring layer for heat dissipation. In addition, in this mounting example, an opening for exposing the metal plate 111 is not formed in the insulating layer 112; however, in a case where the insulating layer 112 is thin, heat generated from the light emitting device 2 can be dissipated to the metal plate 111 via the insulating layer 112.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring substrate comprising:
a heat sink;
an insulating layer formed on the heat sink;
a reflective layer formed on the insulating layer;
a wiring pattern having a first main surface, a second main surface, and a side surface, the side surface being covered by the reflective layer; and
a metal layer formed on the entire first main surface of the wiring pattern,
wherein the insulating layer is in direct contact with the second main surface of the wiring pattern, and
wherein the second main surface of the wiring pattern has a mountain shape rising towards the insulating layer.

2. The wiring substrate of claim 1, wherein a heat conductivity of the insulating layer is higher than that of the reflective layer.

3. A light emitting device comprising:
the wiring substrate of claim 1;
a light emitting element mounted on the wiring substrate; and
an encapsulating resin that encapsulates the light emitting element.

4. A wiring substrate comprising:
a heat sink;
an insulating layer directly on the heat sink;
a reflective layer on the insulating layer;
a wiring pattern disposed in a recess portion formed in the reflective layer, the wiring pattern including a first main surface, a second main surface, and a side surface, the side surface and the second main surface being directly covered by the reflective layer; and
a metal layer formed on the entire first main surface of the wiring pattern,
wherein a surface of the metal layer is flush with an exposed surface of the reflective layer.

5. The wiring substrate of claim 4, wherein a heat conductivity of the insulating layer is higher than that of the reflective layer.

6. A light emitting device comprising:
the wiring substrate of claim 4;
a light emitting element mounted on the wiring substrate; and
an encapsulating resin that encapsulates the light emitting element.

* * * * *